(12) United States Patent
Sorrells et al.

(10) Patent No.: US 7,209,725 B1
(45) Date of Patent: Apr. 24, 2007

(54) ANALOG ZERO IF FM DECODER AND EMBODIMENTS THEREOF, SUCH AS THE FAMILY RADIO SERVICE

(75) Inventors: David F. Sorrells, Jacksonville, FL (US); Michael J. Bultman, Jacksonville, FL (US); Charles D. Clements, Jacksonville, FL (US); Robert W. Cook, Switzerland, FL (US); Joseph M. Hamilla, St. Augustine, FL (US); Richard C. Looke, Jacksonville, FL (US); Charley D. Moses, Jr., Jacksonville, FL (US); Gregory S. Silver, St. Augustine, FL (US)

(73) Assignee: ParkerVision, Inc, Jacksonville, FL (US)

( * ) Notice: Subject to any disclaimer, the term of this patent is extended or adjusted under 35 U.S.C. 154(b) by 0 days.

(21) Appl. No.: 09/476,092
(22) Filed: Jan. 3, 2000

Related U.S. Application Data

(60) Provisional application No. 60/116,848, filed on Jan. 22, 1999.

(51) Int. Cl.
*H04B 1/28* (2006.01)
*H04L 12/56* (2006.01)
*H03K 9/00* (2006.01)
(52) U.S. Cl. .................. 455/333; 370/420; 379/316
(58) Field of Classification Search ............ 455/317, 455/318, 324, 304, 255, 257, 259, 333, 325, 455/126, 127.2, 307, 77, 326; 375/324, 350, 375/346, 216, 326, 327, 344, 316, 322, 329, 375/297, 140, 355; 340/420, 433; 330/10
See application file for complete search history.

(56) References Cited

U.S. PATENT DOCUMENTS 3,246,084 A 4/1966 Kryter
3,614,630 A 10/1971 Rorden (Continued)

FOREIGN PATENT DOCUMENTS

DE 196 27 640 A1 1/1997

(Continued)

OTHER PUBLICATIONS

Partial Translation of Japanese Patent Publication No. 47-2314, 3 pages.

(Continued)

*Primary Examiner*—Naghmeh Mehrpour
(74) *Attorney, Agent, or Firm*—Sterne, Kessler, Goldstein & Fox P.L.L.C.

(57) ABSTRACT

A method and system for directly down-converting FM signals to demodulated baseband information signals that can be used to directly down-convert analog FM signals and digital FM signals to demodulated baseband information signals. In an embodiment, the method includes aliasing an FM signal at an aliasing rate substantially equal to the frequency of the FM signal or substantially equal to a sub-harmonic thereof; adjusting the aliasing rate in accordance with frequency changes on the FM signal to maintain the aliasing rate substantially equal to the frequency of the FM signal, and outputting a demodulated baseband information signal. The method optionally includes compensating for phase delays and/or other characteristics of the loop in order to maintain bandwidth and stability for the loop.

25 Claims, 11 Drawing Sheets

U.S. PATENT DOCUMENTS

| | | | |
|---|---|---|---|
| 3,702,440 A | 11/1972 | Moore | |
| 3,736,513 A | 5/1973 | Wilson | |
| 3,767,984 A | 10/1973 | Shinoda et al. | |
| 3,852,530 A | 12/1974 | Shen | |
| 4,132,952 A | 1/1979 | Hongu et al. | |
| 4,220,977 A | 9/1980 | Yamanaka | |
| 4,250,458 A | 2/1981 | Richmond et al. | |
| 4,384,357 A * | 5/1983 | deBuda et al. | 375/81 |
| 4,441,080 A | 4/1984 | Saari | |
| 4,470,145 A * | 9/1984 | Williams | 375/1 |
| 4,483,017 A | 11/1984 | Hampel et al. | |
| 4,488,119 A | 12/1984 | Marshall | |
| 4,510,467 A | 4/1985 | Chang et al. | |
| 4,633,510 A | 12/1986 | Suzuki et al. | |
| 4,660,164 A | 4/1987 | Leibowitz | |
| 4,761,798 A | 8/1988 | Griswold, Jr. et al. | |
| 4,772,853 A | 9/1988 | Hart | |
| 4,857,928 A | 8/1989 | Gailus et al. | |
| 4,873,492 A | 10/1989 | Myer | |
| 4,972,436 A | 11/1990 | Halim et al. | |
| 5,012,245 A | 4/1991 | Scott et al. | |
| 5,016,242 A | 5/1991 | Tang | |
| 5,058,107 A | 10/1991 | Stone et al. | |
| 5,062,122 A | 10/1991 | Pham et al. | |
| 5,157,687 A | 10/1992 | Tymes | 375/1 |
| 5,179,731 A | 1/1993 | Tränkle et al. | |
| 5,196,806 A | 3/1993 | Ichihara | |
| 5,218,562 A | 6/1993 | Basehore et al. | |
| 5,239,496 A | 8/1993 | Vancraeynest | |
| 5,260,973 A | 11/1993 | Watanabe | |
| 5,282,222 A | 1/1994 | Fattouche et al. | |
| 5,345,239 A | 9/1994 | Madni et al. | |
| 5,369,789 A | 11/1994 | Kosugi et al. | |
| 5,389,839 A | 2/1995 | Heck | |
| 5,410,195 A | 4/1995 | Ichihara | |
| 5,410,270 A | 4/1995 | Rybicki et al. | |
| 5,410,326 A | 4/1995 | Goldstein | |
| 5,416,449 A | 5/1995 | Joshi | |
| 5,422,909 A | 6/1995 | Love et al. | |
| 5,438,329 A | 8/1995 | Gastouniotis et al. | |
| 5,440,311 A | 8/1995 | Gallagher et al. | |
| 5,471,665 A | 11/1995 | Pace et al. | |
| 5,481,570 A | 1/1996 | Winters | |
| 5,483,695 A * | 1/1996 | Pardoen | 455/314 |
| 5,490,176 A | 2/1996 | Peltier | |
| 5,564,097 A | 10/1996 | Swanke | |
| 5,589,793 A | 12/1996 | Kassapian | |
| 5,600,680 A * | 2/1997 | Mishima et al. | 375/327 |
| 5,606,731 A * | 2/1997 | Pace et al. | 455/260 |
| 5,628,055 A | 5/1997 | Stein | 455/89 |
| 5,633,815 A | 5/1997 | Young | |
| 5,636,140 A | 6/1997 | Lee et al. | |
| 5,678,220 A | 10/1997 | Fournier | 455/302 |
| 5,678,226 A | 10/1997 | Li et al. | |
| 5,682,099 A | 10/1997 | Thompson et al. | |
| 5,697,074 A | 12/1997 | Makikallio et al. | |
| 5,703,584 A | 12/1997 | Hill | |
| 5,745,846 A | 4/1998 | Myer et al. | |
| 5,757,858 A | 5/1998 | Black et al. | |
| 5,760,629 A | 6/1998 | Urabe et al. | |
| 5,760,632 A | 6/1998 | Kawakami et al. | |
| 5,784,689 A | 7/1998 | Kobayashi | |
| 5,787,125 A | 7/1998 | Mittel | |
| 5,834,979 A | 11/1998 | Yatsuka | |
| 5,870,670 A * | 2/1999 | Ripley et al. | 455/304 |
| 5,878,088 A | 3/1999 | Knutson et al. | |
| 5,887,001 A | 3/1999 | Russell | |
| 5,896,304 A | 4/1999 | Tiemann et al. | |
| 5,898,912 A | 4/1999 | Heck et al. | |
| 5,926,065 A | 7/1999 | Wakai et al. | 329/304 |
| 5,926,513 A | 7/1999 | Suominen et al. | |
| 5,937,013 A | 8/1999 | Lam et al. | |
| 5,945,660 A | 8/1999 | Nakasuji et al. | 235/462.46 |
| 5,949,827 A | 9/1999 | DeLuca et al. | |
| 5,955,992 A | 9/1999 | Shattil | |
| 5,956,025 A | 9/1999 | Goulden et al. | |
| 5,970,053 A | 10/1999 | Schick et al. | |
| 5,982,315 A | 11/1999 | Bazarjani et al. | |
| 5,982,329 A | 11/1999 | Pittman et al. | |
| 5,995,030 A | 11/1999 | Cabler | |
| 5,999,561 A | 12/1999 | Naden et al. | |
| 6,005,506 A | 12/1999 | Bazarjani et al. | |
| 6,005,903 A | 12/1999 | Mendelovicz | |
| 6,014,176 A | 1/2000 | Nayebi et al. | |
| 6,014,551 A | 1/2000 | Pesola et al. | |
| 6,018,262 A | 1/2000 | Noro et al. | |
| 6,018,553 A | 1/2000 | Sanielevici et al. | |
| 6,026,286 A | 2/2000 | Long | |
| 6,031,217 A | 2/2000 | Aswell et al. | |
| 6,047,026 A | 4/2000 | Chao et al. | |
| 6,049,573 A | 4/2000 | Song | |
| 6,049,706 A | 4/2000 | Cook et al. | 455/313 |
| 6,061,551 A | 5/2000 | Sorrells et al. | 455/118 |
| 6,061,555 A | 5/2000 | Bultman et al. | 455/313 |
| 6,064,054 A | 5/2000 | Waczynski et al. | |
| 6,067,329 A | 5/2000 | Kato et al. | |
| 6,073,001 A | 6/2000 | Sokoler | |
| 6,076,015 A | 6/2000 | Hartley et al. | |
| 6,078,630 A | 6/2000 | Prasanna | |
| 6,084,465 A | 7/2000 | Dasgupta | |
| 6,085,073 A | 7/2000 | Palermo et al. | |
| 6,091,289 A | 7/2000 | Song et al. | |
| 6,091,939 A | 7/2000 | Banh | 455/102 |
| 6,091,940 A | 7/2000 | Sorrells et al. | 455/118 |
| 6,091,941 A | 7/2000 | Moriyama et al. | 455/126 |
| 6,094,084 A | 7/2000 | Abou-Allam et al. | |
| 6,098,046 A | 8/2000 | Cooper et al. | |
| 6,098,886 A | 8/2000 | Swift et al. | 235/472.01 |
| 6,127,941 A | 10/2000 | Van Ryzin | |
| 6,144,331 A | 11/2000 | Jiang | |
| 6,151,354 A | 11/2000 | Abbey | |
| 6,160,280 A | 12/2000 | Bonn et al. | |
| 6,169,733 B1 | 1/2001 | Lee | |
| 6,178,319 B1 | 1/2001 | Kashima | |
| 6,182,011 B1 | 1/2001 | Ward | |
| 6,204,789 B1 | 3/2001 | Nagata | |
| 6,208,636 B1 | 3/2001 | Tawil et al. | |
| 6,215,475 B1 | 4/2001 | Meyerson et al. | 345/173 |
| 6,215,828 B1 | 4/2001 | Signell et al. | |
| 6,230,000 B1 | 5/2001 | Tayloe | |
| 6,266,518 B1 | 7/2001 | Sorrells et al. | 455/118 |
| 6,298,065 B1 | 10/2001 | Dombkowski et al. | |
| 6,307,894 B2 | 10/2001 | Eidson et al. | |
| 6,314,279 B1 * | 11/2001 | Mohindra | 455/304 |
| 6,317,589 B1 | 11/2001 | Nash | |
| 6,327,313 B1 | 12/2001 | Traylor et al. | |
| 6,330,244 B1 | 12/2001 | Swartz et al. | |
| 6,335,656 B1 | 1/2002 | Goldfarb et al. | |
| 6,353,735 B1 | 3/2002 | Sorrells et al. | 455/118 |
| 6,363,262 B1 | 3/2002 | McNicol | |
| 6,366,622 B1 | 4/2002 | Brown et al. | |
| 6,370,371 B1 | 4/2002 | Sorrells et al. | 455/323 |
| 6,400,963 B1 | 6/2002 | Glöckler et al. | |
| 6,404,823 B1 | 6/2002 | Grange et al. | |
| 6,421,534 B1 | 7/2002 | Cook et al. | |
| 6,437,639 B1 | 8/2002 | Nguyen et al. | |
| 6,438,366 B1 | 8/2002 | Lindfors et al. | |
| 6,459,721 B1 | 10/2002 | Mochizuki et al. | |
| 6,509,777 B2 | 1/2003 | Razavi et al. | |
| 6,516,185 B1 | 2/2003 | MacNally | |
| 6,531,979 B1 | 3/2003 | Hynes | |
| 6,542,722 B1 | 4/2003 | Sorrells et al. | |
| 6,560,301 B1 | 5/2003 | Cook et al. | |
| 6,580,902 B1 | 6/2003 | Sorrells et al. | |

| | | | |
|---|---|---|---|
| 6,600,795 B1 | 7/2003 | Ohta et al. | |
| 6,600,911 B1 | 7/2003 | Morishige et al. | |
| 6,608,647 B1 | 8/2003 | King | |
| 6,611,569 B1 | 8/2003 | Schier et al. | |
| 6,618,579 B1 | 9/2003 | Smith et al. | |
| 6,634,555 B1 | 10/2003 | Sorrells et al. | |
| 6,639,939 B1 | 10/2003 | Naden et al. | |
| 6,647,250 B1 | 11/2003 | Bultman et al. | |
| 6,686,879 B2 | 2/2004 | Shattil | |
| 6,687,493 B1 | 2/2004 | Sorrells et al. | |
| 6,690,232 B2 | 2/2004 | Ueno et al. | |
| 6,694,128 B1 | 2/2004 | Sorrells et al. | |
| 6,697,603 B1 | 2/2004 | Lovinggood et al. | |
| 6,704,549 B1 | 3/2004 | Sorrells et al. | |
| 6,704,558 B1 | 3/2004 | Sorrells et al. | |
| 6,798,351 B1 | 9/2004 | Sorrells et al. | |
| 6,813,485 B2 | 11/2004 | Sorrells et al. | |
| 6,836,650 B2 | 12/2004 | Sorrells et al. | |
| 6,882,194 B2 | 4/2005 | Belot et al. | |
| 6,892,062 B2 | 5/2005 | Lee et al. | |
| 6,917,796 B2 | 7/2005 | Setty et al. | |
| 6,920,311 B2 | 7/2005 | Rofougaran et al. | |
| 6,963,734 B2 | 11/2005 | Sorrells et al. | |
| 2001/0015673 A1 | 8/2001 | Yamashita et al. | |
| 2002/0037706 A1 | 3/2002 | Ichihara | |
| 2002/0080728 A1 | 6/2002 | Sugar et al. | |
| 2002/0163921 A1 | 11/2002 | Ethridge et al. | |
| 2003/0045263 A1 | 3/2003 | Wakayama et al. | |
| 2003/0068990 A1* | 4/2003 | Sorrells et al. | 455/118 |
| 2003/0081781 A1* | 5/2003 | Jensen et al. | 380/253 |

FOREIGN PATENT DOCUMENTS

| | | |
|---|---|---|
| DE | 196 48 915 A1 | 6/1998 |
| EP | 0 087 336 A1 | 8/1983 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 632 577 A1 | 1/1995 |
| EP | 0 643 477 A2 | 3/1995 |
| EP | 0 643 477 A3 | 3/1995 |
| EP | 0 789 449 A2 | 8/1997 |
| EP | 0 877 476 A1 | 11/1998 |
| EP | 0 977 351 A1 | 2/2000 |
| FR | 2 669 787 A1 | 5/1992 |
| GB | 2 324 919 A | 11/1998 |
| JP | 47-2314 | 2/1972 |
| JP | 55-66057 | 5/1980 |
| JP | 58-7903 | 1/1983 |
| JP | 58-133004 | 8/1983 |
| JP | 60-58705 | 4/1985 |
| JP | 60-130203 | 7/1985 |
| JP | 61-30821 | 2/1986 |
| JP | 63-65587 | 3/1988 |
| JP | 63-153691 | 6/1988 |
| JP | 4-123614 | 4/1992 |
| JP | 4-127601 | 4/1992 |
| JP | 5-175730 | 7/1993 |
| JP | 5-175734 | 7/1993 |
| JP | 5-327356 | 12/1993 |
| JP | 7-154344 | 6/1995 |
| JP | 7-307620 | 11/1995 |
| WO | WO 95/01006 A1 | 1/1995 |
| WO | WO 97/08839 A2 | 3/1997 |
| WO | WO 97/08839 A3 | 3/1997 |

OTHER PUBLICATIONS

Partial Translation of Japanese Patent Publication No. 58-7903, 3 pages.
English-language Abstract of Japanese Patent Publication No. 58-133004, from http://www1.ipdl.jpo.go.jp, 2 Pages (Aug. 8, 1993—Date of publication of application).
English-language Abstract of Japanese Patent Publication No. 60-058705, from http://www1.ipdl.jpo.go.jp, 1 Page (Apr. 4, 1985—Date of publication of application).
English-language Abstract of Japanese Patent Publication No. 04-123614, from http://www1.ipdl.jpo.go.jp, 1 Page (Apr. 23, 1992—Date of publication od application).
English-language Abstract of Japanese Patent Publication No. 04-127601, from http://www1.ipdl.jpo.go.jp, 1 Page (Apr. 28, 1992—Date of publication of application).
English-language Abstract of Japanese Patent Publication No. 05-175730, from http://www1.ipdl.jpo.go.jp, 1 Page (Jul. 13, 1993—Date of publication of application).
English-language Abstract of Japanese Patent Publication No. 05-175734, from http://www1.ipdl.jpo.go.jp, 1 Page (Jul. 13, 1993—Date of publication of application.
English-language Abstract of Japanese Patent Publication No. 07-154344, from http://www1.ipdl.jpo.go.jp, 2 Pages (Jun. 16, 1995—Date of publication of application).
English-language Abstract of Japanese Patent Publication No. 07-307620, from http://www1.ipdl.jpo.go.jp, 1 Page (Nov. 21, 1995—Date of publication of application).
Oppenheim, A.V. and Schafer, R.W., *Digital Signal Processing*, Prentice-Hall, pp. vii-x, 6-35, 45-78, 87-121 and 136-165 (1975).
English-language Abstract of Japanese Patent Publication No. 55-066057, from http://www1.ipdl.jpo.go.jp, 1 Page (May 19, 1980—Date of publication of application).
English-language Abstract of Japanese Patent Publication No. 63-065587, from http://www1.ipdl.jpo.go.jp, 1 Page (Mar. 24, 1988—Date of publication of application).
English-language Abstract of Japanese Patent Publication No. 63-153691, from http://www1.ipdl.jpo.go.jp, 1 Page (Jun. 27, 1988—Date of publication of application).
Translation of Japanese Patent Publication No. JP 60-130203, 3 pages.
Razavi, B., A 900-MHz/1.8-Ghz CMOS Transmitter for Dual-Band Applications, *Symposium on VLSI Circuits Digest of Technical Papers*, IEEE, pp. 128-131 (1998).
Ritter, G.M., "SDA, A New Solution for Tranceivers," *16th European Microwave Conference*, Microwave Exhibitions and Publishers, pp. 729-733 (Sep. 8, 1986).
DIALOG File 351 (Derwent WPI) English Language Patent Abstract for FR 2 669 787, 1 page (May 29, 1992—Date of publication of application).
U.S. Appl. No. 09/476,091, filed Jan. 3, 2000, Sorrells et al.
U.S. Appl. No. 09/476, 093, filed Jan. 3, 2000, Sorrells et al.
Akos, D.M. et al., "Direct Bandpass Sampling of Multiple Distinct RF Signals," *IEEE Transactions on Communications*, IEEE, vol. 47, No. 7, pp. 983-988 (Jul. 1999).
Patel, M. et al., "Bandpass Sampling for Software Radio Receivers, and the Effect of Oversampling on Aperture Jitter," *VTC 2002*, IEEE, pp. 1901-1905 (2002).
English-language Abstract of Japanese Patent Publication No. 61-030821, 1 Page (Feb, 13, 1986—Date of publication of application).
English-language Abstract of Japanese Patent Publication No. 05-327356, 1 Page (Dec. 10, 1993—Date of publication of application.
Simoni, A. et al. , "A Single-Chip Optical Sensor with Analog Memory for Motion Detection," *IEEE Journal of Solid-State Circuits*, IEEE, vol. 30, No. 7, pp. 800-806 (Jul. 1995).
English Translation of German Patent Publication No. DE 196 48 915 A1, 10 pages.
Tayloe, D., "A Low noise, High-performance Zero IF Quadrature Detector/Preamplifier," *RF Design*, Primedia Business Magazines & Media, Inc., pp. 58, 60, 62 and 69 (Mar. 2003).
Deboo, Gordon J., *Integrated Circuits and Semiconductor Devices*, 2nd Edition, McGraw-Hill, Inc., pp. 41-45 (1977).

* cited by examiner

ANALOG ZERO IF FM DECODER AND EMBODIMENTS THEREOF, SUCH AS THE FAMILY RADIO SERVICE

CROSS-REFERENCE TO OTHER APPLICATIONS

This application claims the benefit of U.S. Provisional Application No. 60/116,484, filed Jan. 22, 1999.

The following applications of common assignee are related to the present application, and are herein incorporated by reference in their entireties:

"Method and System for Down-Converting Electromagnetic Signals," Serial No. 09/176,022, filed on Oct. 21, 1998 (now U.S. Pat. No. 6,061,551).

"Method and System for Frequency Up-Conversion," Ser. No. 09/176,154, filed on Oct. 21, 1998 (now U.S. Pat. No. 6,091,940).

"Method and System for Ensuring Reception of a Communications Signal," Ser. No. 09/176,415, filed on Oct. 21, 1998 (now U.S. Pat. No. 6,061,555).

"Integrated Frequency Translation and Selectivity," Ser. No. 09/175,966, filed on Oct. 21, 1998 (now U.S. Pat. No. 6,049,706).

"Image-Reject Down-Converter and Embodiments Thereof, Such as the Family Radio Service," Ser. No. 09/476,091, filed Jan. 3, 2000.

"Communication System With Multi-Mode and Multi-Band Functionality and Embodiments Thereof, Such as the Family Radio Service," Ser. No. 09/476,093, filed Jan. 3, 2000.

"Multi-Mode, Multi-Band Communication System," Ser. No. 09/476,330, filed Jan. 3, 2000.

BACKGROUND OF THE INVENTION

1. Field of the Invention

The present invention is generally directed toward receiver-transmitter systems referred to as Family Radio Service (FRS) units, although the invention is not limited to this embodiment. The Family Radio Service (FRS) is one of the Citizens Band Radio Services. It is intended for the use of family, friends, and associates to communicate among themselves within a neighborhood or while on group outings. There are fourteen discreet FRS channels available for use on a "take turns" basis. The FRS unit channel frequencies are:

| Channel No. | (MHz) |
| --- | --- |
| 1 | 462.5625 |
| 2 | 462.5875 |
| 3 | 462.6125 |
| 4 | 462.6375 |
| 5 | 462.6625 |
| 6 | 462.6875 |
| 7 | 462.7125 |
| 8 | 467.5625 |
| 9 | 467.5875 |
| 10 | 467.6125 |
| 11 | 467.6375 |
| 12 | 467.6625 |
| 13 | 467.6875 |
| 14 | 467.7125 |

Other selected technical specifications are:
(a) Frequency modulation (although phase modulation is allowed);
(b) Frequency tolerance of each FRS unit must be maintained within 0.00025%;
(c) The authorized bandwidth for an FRS unit is 12.5 KHz; and
(d) Effective radiated power (ERP) shall not, under any condition of modulation, exceed 0.500 W.

The operating rules for the FRS are found at 47 C.F.R. 95.191–95.194. For additional technical information, see 47 C.F.R. 95.601–95.669.

2. Related Art

A variety of FRS systems are available. Presently available FRS systems do not directly down-convert FM signals to demodulated baseband information signals.

What is needed is a method and system for directly down-converting FM signals to demodulated baseband information signals.

SUMMARY OF THE INVENTION

The present invention is directed to a communications system comprising a method and system for directly down-converting FM signals to demodulated baseband information signals. The invention has a number of aspects, including a ultra-low power down-converter and a high-efficiency transmitter and can be used to directly down-convert analog FM signals and digital FM signals to demodulated baseband information signals. In an embodiment, the present invention is used in a family radio service unit. It is to be understood, however, that the invention is not limited to this particular embodiment. Other implementations in communications-related environments are within the scope and spirit of the invention.

In an embodiment, the invention includes aliasing an FM signal at an aliasing rate substantially equal to the frequency of the FM signal or substantially equal to a sub-harmonic thereof; adjusting the aliasing rate in accordance with frequency changes on the FM signal to maintain the aliasing rate substantially equal to the frequency of the FM signal; and outputting a demodulated baseband information signal.

The invention includes an optional step of compensating for phase delays and/or other characteristics of the loop in order to maintain bandwidth and stability for the loop.

In an embodiment, the invention is implemented as a zero IF FM decoder that down-converts an FM signal as an I and Q pair, sums the I and Q pair, and generates a correction signal from the sum. The correction signal is used to adjust the aliasing rate to continually alias the FM signal at a sub-harmonic of the FM signal—even as the FM signal changes frequency.

In an embodiment, the invention is implemented as an ultra-low power down-converter. In an embodiment, the invention is implemented as a transceiver, which can be an FRS transceiver.

Advantages of the invention include, but are not limited to, power reduction, parts reduction, price reduction, size reduction, performance increase, efficiency, and integration possibilities.

DETAILED DESCRIPTION OF THE PREFERRED EMBODIMENTS

Family Radio with Zero IF FM Decoder

U.S. patent application Ser. No. 09/176,022, titled, "Method and System for Down-Converting Electromagnetic Signals," (now U.S. Pat. No. 6,061,551; hereinafter referred to as the '551 patent) incorporated herein by reference in its entirety, discloses methods and systems for directly down-converting EM signals.

The '551 patent discloses, among other things, how modulated EM signals can be directly down-converted to demodulated baseband information signals (also referred to interchangeably herein as direct to data or D2D embodiments). For example, amplitude modulated (AM) signals and phase modulated (PM) signals can be directly down-converted to demodulated baseband information signals by aliasing the AM and PM signals at sub-harmonics of the AM and PM signals.

Frequency modulated (FM) signals, however, pose special challenges. For example, the '551 patent discloses how frequency shift keying (FSK) signals, when aliased at a fixed sub-harmonic, are down-converted to amplitude shift keying signals or to phase shift keying (PSK) signals. FM signals, unlike AM and PM signals, are not necessarily directly down-converted to demodulated baseband information signals by aliasing at a fixed sub-harmonic.

The present invention is a method and system for directly down-converting FM signals to demodulated baseband information signals.

Figure 4:
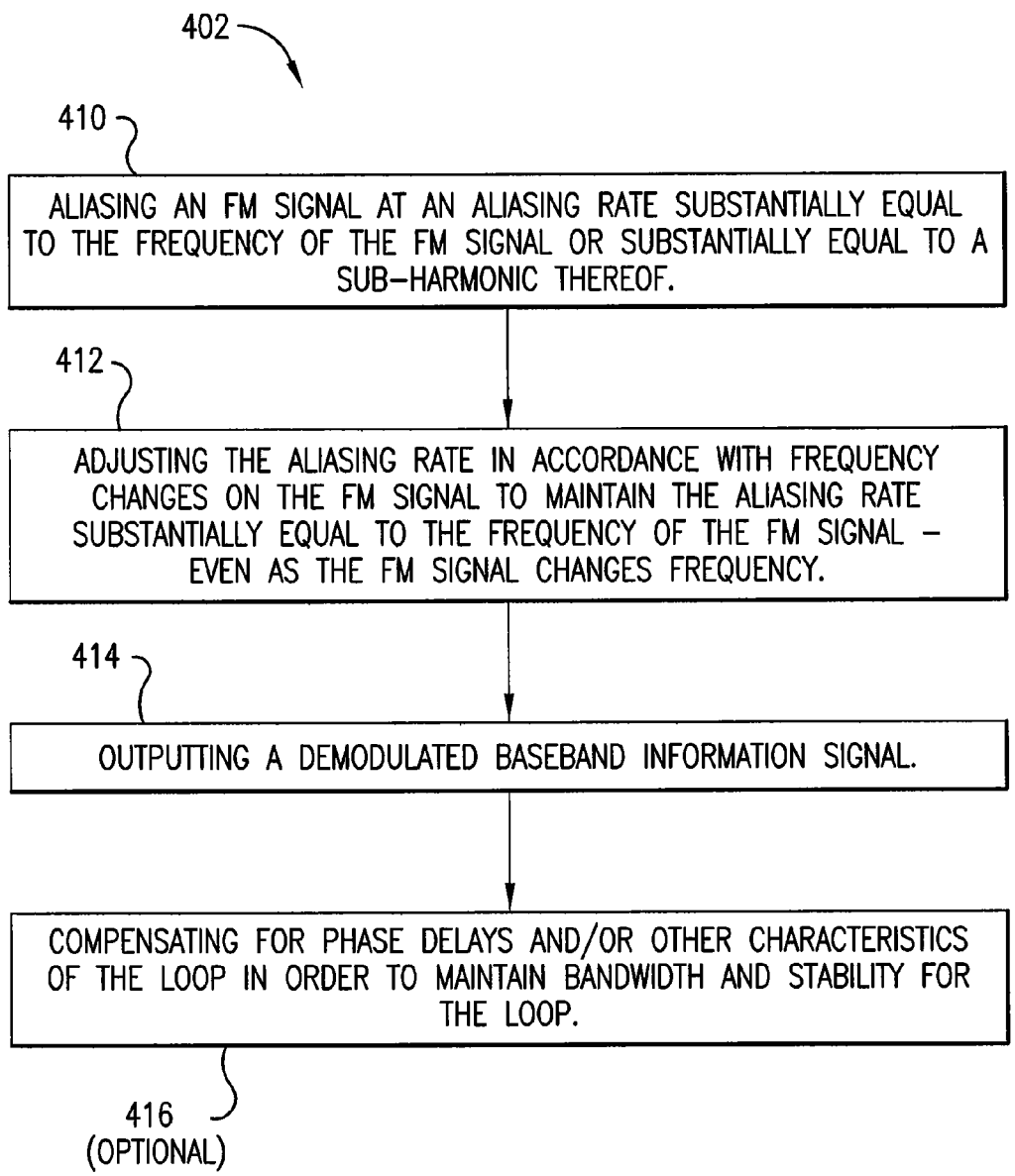
FIG. 4 illustrates a process for directly down-converting an FM signal to a demodulated baseband information signal.
Figure 5:
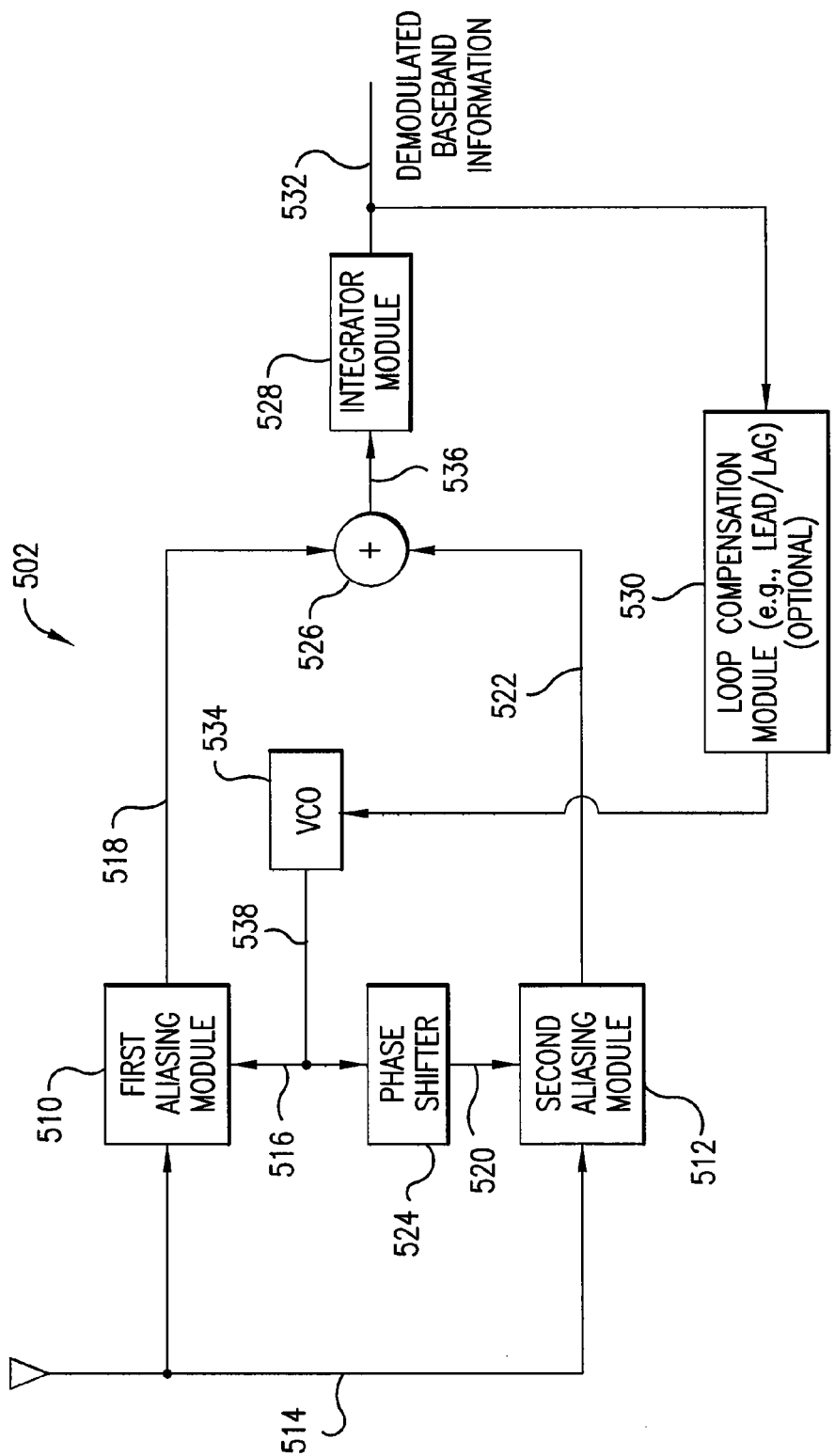
FIG. 5 is a block diagram of an exemplary zero IF FM decoder for implementing the process of FIG. 4.

FIG. 4 is a flowchart 402 that illustrates a method for directly down-converting FM signals to demodulated baseband information signals. FIG. 5 illustrates an exemplary embodiment of a zero IF FM decoder 502, which can be used to implement the process illustrated in the flowchart 402. The process illustrated in the flowchart 402 is not, however, limited to the zero IF FM decoder 502. Upon reading this disclosure, one skilled in the relevant art(s) will recognize that the process illustrated in the flowchart 402 can be practiced by other systems as well.

Figure 1:
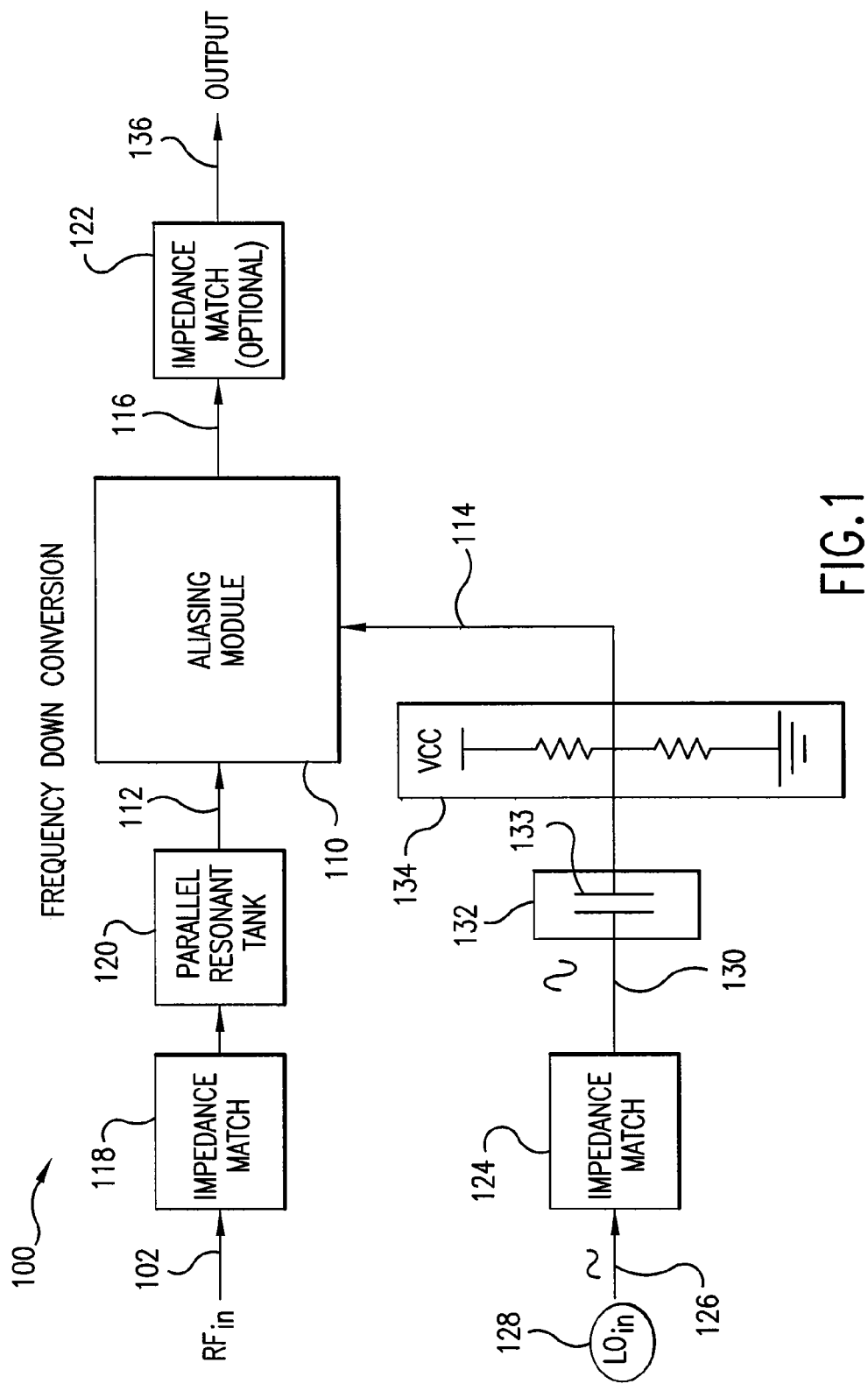
FIG. 1 is a high level block diagram of an ultra-low power down-converter in accordance with the present invention.
Figure 2:
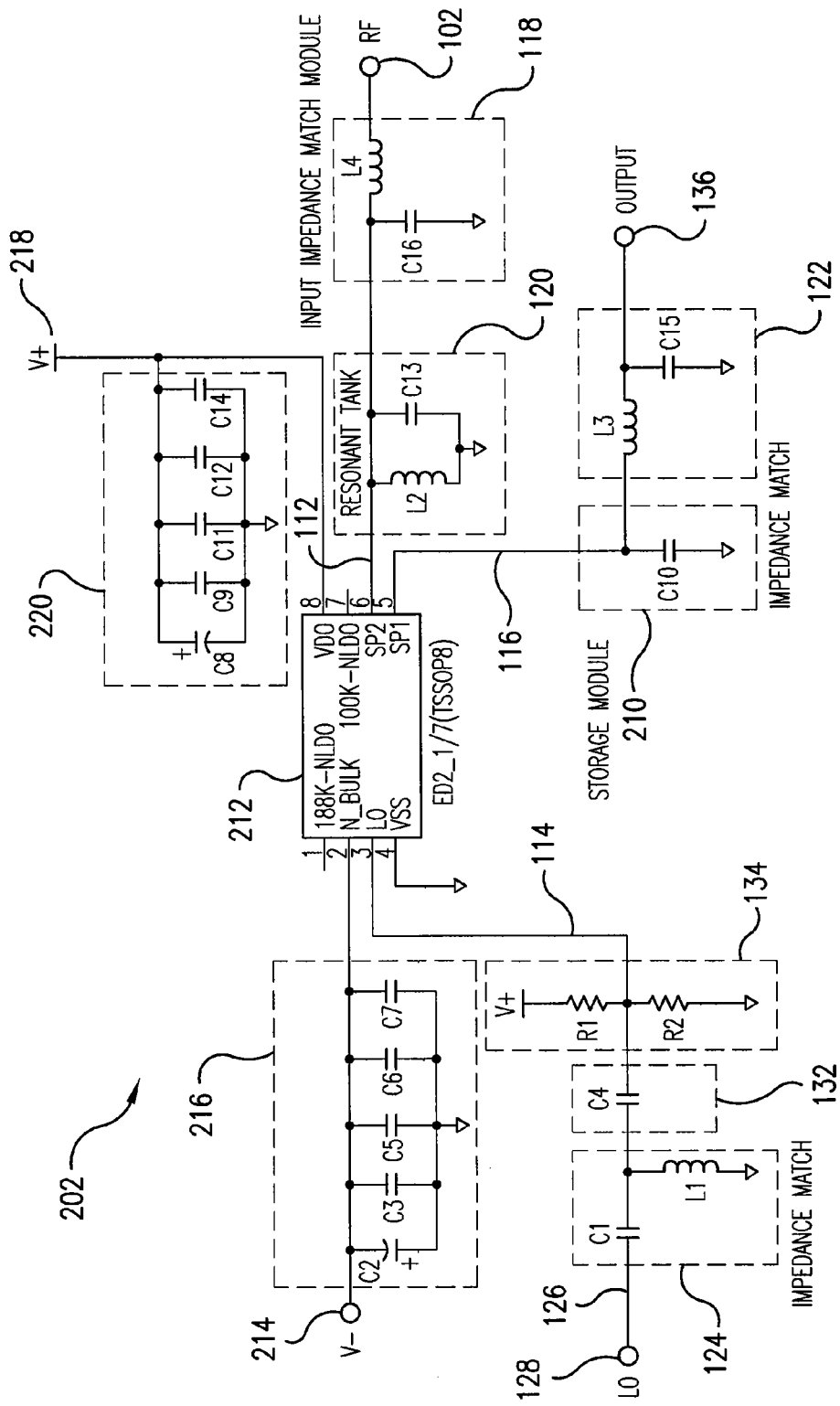
FIG. 2 is a schematic diagram of an exemplary implementation of the ultra-low power down-converter illustrated in FIG. 1.
Figure 3:
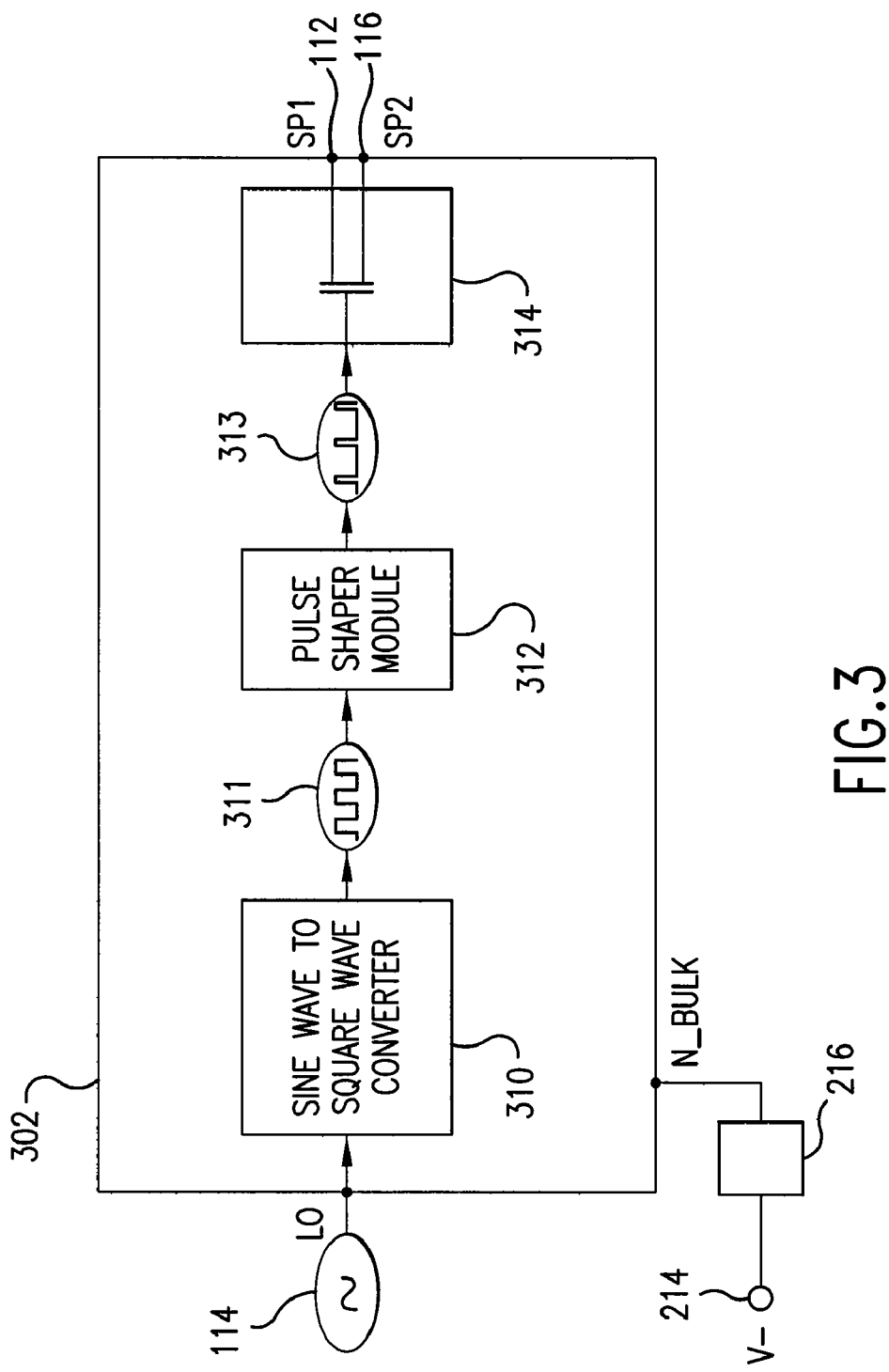
FIG. 3 is a detailed block diagram of an aliasing module (i.e., universal frequency translator), in accordance with the present invention.

The zero IF FM decoder 502 includes a first aliasing module 510 and a second aliasing module 512. Preferably, the first and second aliasing modules 510 and 512 are implemented as disclosed in the '551 patent and may be optimized as illustrated in FIGS. 1–3 of the present application and as described above. Other components of the zero IF FM decoder 502 are described below with the description of the process flowchart 402.

The process begins at step 410, which includes aliasing an FM signal at an aliasing rate substantially equal to the frequency of the FM signal or substantially equal to a sub harmonic thereof.

In FIG. 5, step 410 is performed by the first and second aliasing module 510 and 512. The first aliasing module 510 receives an FM signal 514 and a first LO signal 516. The first LO signal 516 is substantially equal to the frequency of the FM signal 514 or a sub-harmonic thereof. Details of maintaining the LO signal 516 at the frequency of the FM signal 514, or a sub-harmonic thereof, is described in connection with step 412 below. The first aliasing module 510 uses the first LO signal 516 to down-convert the FM signal 514 to a first down-converted signal 518, as disclosed in the '551 patent.

The second aliasing module 512 also receives the FM signal 514 and a second LO signal 520. The first LO signal 516 and the second LO signal 520 are substantially similar except that one is shifted in phase relative to the other. This is performed by, for example, a phase shifter 524. A variety of implementations of the phase shifter 524 suitable for the present invention are available as will be apparent to persons skilled in the relevant art, based on the teachings herein.

In an exemplary embodiment, the first and second LO signals 516 and 520 are separated by ¼ period of the FM signal 514, or any multiple of a period of the FM signal 514 plus ¼ period. Other phase differences are contemplated and are within the scope of the present invention. The second aliasing module 512 uses the second LO signal 520 to down-convert the FM signal 514 to a second down-converted signal 522, as disclosed in the '551 patent.

Step 412 includes adjusting the aliasing rate in accordance with frequency changes on the FM signal to maintain the aliasing rate substantially equal to the frequency of the FM signal.

The '551 patent teaches that, so long as an aliasing rate remains substantially equal to the frequency of an FM signal, the resultant down-converted signal is substantially a constant level. In the case of the zero IF FM decoder 502, therefore, the first and second down-converted signals 518 and 522 should generally be constant signals.

In order to maintain this condition, the zero IF FM decoder 502 maintains the phase of the aliasing signal 538 so that the phase of one of the aliasing signals 516 or 520 slightly leads the FM signal 514 while phase of the other aliasing signal slightly lags the FM signal 514.

As a result, one of the down-converted signals 518 or 522 is a constant level above DC while the other down-converted signal is a constant level below DC. The sum of the down-converted signals 518 and 522 is thus substantially zero. Summation of the down-converted signals 518 and 522 is performed by a summing module 526, which outputs a summation signal 536.

When summation signal 536 tends away from zero, it indicates that the frequency of the FM signal 514 is changing. The summation signal 536 is integrated by an integrator module 528, which outputs a control signal 532. The control signal 532 controls a voltage controlled oscillator (VCO) 534, which outputs the aliasing signal 538. The integrator maintains the control signal at a level necessary to insure that the FM signal 514 is aliased at a sub harmonic of the FM signal—even as the FM signal 514 changes frequency.

Figure 7:
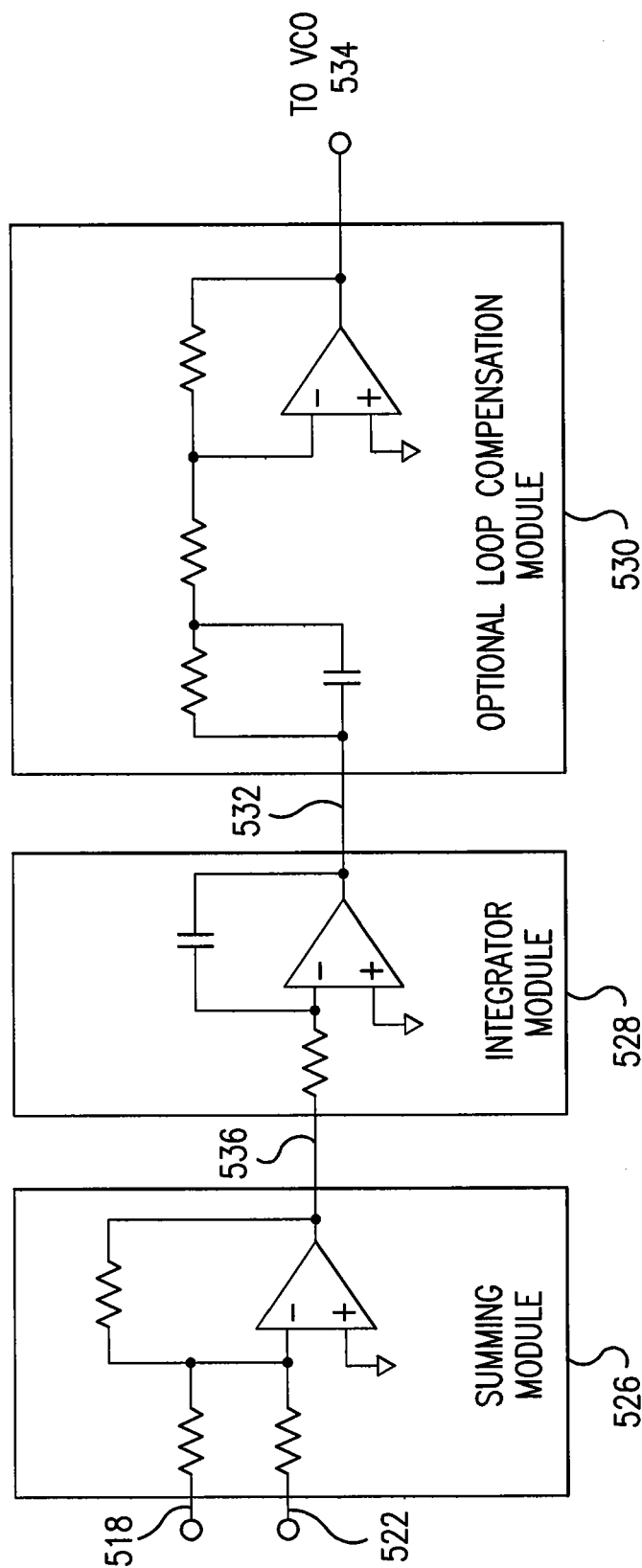
FIG. 7 is a schematic diagram of an exemplary implementation of a summing module, an integration module and an optional loop compensation module, in accordance with the present invention.

FIG. 7 illustrates, among other things, exemplary implementation details of the summing module 526 and the integrator module 528. A variety of other implementations of the summing module 526 and the integrator module 528, suitable for the present invention, are available, as will be apparent to persons skilled in the relevant art, based on the teachings herein. A variety of implementations of the VCO 534 suitable for the present invention are also available as will be apparent to persons skilled in the relevant art, based on the teachings herein.

Figure 6:
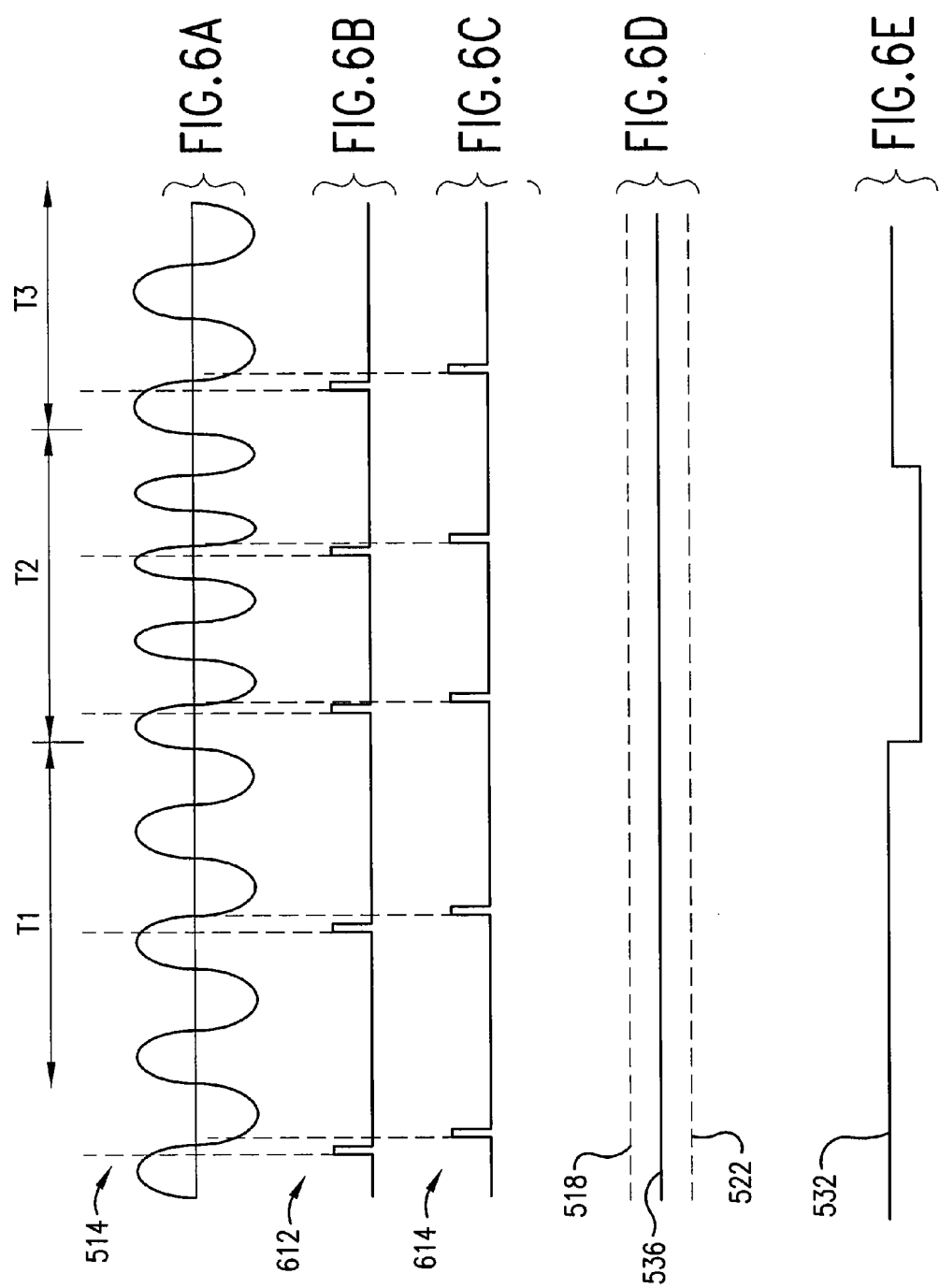
FIG. 6A is a timing diagram of an exemplary FM signal.
FIG. 6B is a timing diagram of an exemplary first aliasing signal, in accordance with the present invention.
FIG. 6C is a timing diagram of an exemplary second aliasing signal, in accordance with the present invention.
FIG. 6D is a timing diagram of exemplary down-converted signals and a summation signal, in accordance with the present invention.
FIG. 6E illustrates an exemplary control signal for controlling an aliasing rate for directly down-converting an FM signal to a demodulated baseband information signal, in accordance with the present invention.

FIGS. 6A–6D illustrate exemplary timing diagrams for the above description. FIG. 6A illustrates an exemplary FM signal 514. FIG. 6B illustrates a first aliasing signal 612, which is generated within the first aliasing module 510 from the first LO signal 516. FIG. 6C illustrates a second aliasing signal 614, which is generated within the second aliasing module 512 from the second LO signal 520. The first and second aliasing signals 612 and 614 are separated by approximately ¼ period of the FM signal 514.

In operation, the first LO signal 612 aliases the FM signal 514 at approximately the same positive position on successive periods. The result is illustrated in FIG. 6D as down-converted signal 518. Similarly, the second LO signal 614 aliases the FM signal 514 at approximately the same negative position on successive periods. The result is illustrated in FIG. 6D as down-converted signal 522. FIG. 6D illustrates the sum of the down-converted signals 518 and 522 as summation signal 536.

When the frequency of the FM signal 514 changes, summation signal 536 tends away from zero. When this happens, the output of the integrator module 528—i.e., control signal 532—changes accordingly so that the VCO 534 changes the aliasing rate of the aliasing signal 538 so that the sum of the down-converted signals 518 and 520, summation signal 536, is maintained at zero. Thus, the control signal 532 changes in proportion to frequency changes on the FM signal 514. The changes on the FM signal 514 form a demodulated baseband information signal, which represents the information that had been frequency modulated on the FM signal 514.

In other words, as the frequency of the FM signal 514 changes, the integrator module 528 changes the control signal 532 to track and follow the deviation. This will reproduce—within the bandwidth of the loop—any arbitrary wave form, including analog and digital.

Another way of explaining it is to say that the invention tracks frequency changes on the FM signal by aliasing the FM signal at a sub-harmonic of the FM signal, adjusting the aliasing rate as necessary to maintain the aliasing rate at the sub-harmonic—even as the FM signal changes frequency.

In this way, the aliasing rate changes in proportion to frequency changes on the FM signal. Thus, changes to the aliasing rate are directly indicative of the information modulated on the FM signal. In the exemplary embodiment of FIG. 5, changes to the aliasing rate are indicated by the control voltage 532, which controls the VCO 534, which determines the aliasing rate.

FIG. 6E illustrates an exemplary control signal 532 for controlling the aliasing rate for directly down-converting the exemplary FM signal 514 illustrated in FIG. 6A to a demodulated baseband information signal. In this example, the control signal 532 has a first amplitude during time T1, when the FM signal 514 is at a first frequency. The control signal 532 has a second amplitude during time T2, when the FM signal 514 is at a second frequency. The control signal 532 reverts to the first amplitude during time T3, when the FM signal 514 returns to the first frequency. One skilled in the relevant art(s) will recognize, based on the disclosure herein, that the timing diagrams of FIGS. 6A–6E are exemplary illustrations of the invention. Other timing diagrams will apply for different situations, all of which are within the scope of the present invention.

Step 414 includes outputting a demodulated baseband information signal. In FIG. 5, this is performed by outputting the control signal 532 as a demodulated baseband information signal An optional step 416 includes compensating for phase delays and/or other characteristics of the loop in order to maintain bandwidth and stability for the loop. In FIG. 5, step 416 is performed by an optional loop compensator module 530. FIG. 7 illustrates exemplary implementation details of the loop compensation module 530. A variety of other loop compensation modules suitable for the present invention are available as will be apparent to persons skilled in the relevant art, based on the teachings herein.

In an embodiment, a zero IF FM decoder as described above is implemented in an FRS.

Other advantages of the zero IF FM decoder include tuning reduction, parts reduction, price reduction, size reduction, performance increase, low frequency and power LO, and excellent linearity. Another advantage is that it can down-convert EM signals as high as 3.5 GHz when implemented in CMOS. Higher frequencies can be down-converted using other materials such as GaAs, for example.

Exemplary Environment: Ultra-Low Power Down-Converter

The present invention can be implemented with an aliasing system as disclosed in '551 patent, incorporated herein by reference in its entirety.

FIG. 1 illustrates an exemplary aliasing system 100 for down-converting electromagnetic (EM) signals, such as an RF input ($RF_{in}$) signal 102. The aliasing system 100 is an exemplary embodiment of an optimized aliasing system, referred to herein as an ultra low power down-converter.

The exemplary aliasing system 100 includes an aliasing module 110 that aliases an EM signal 112, using an aliasing signal 114, and outputs a down-converted signal 116, as disclosed in '551 patent, incorporated herein by reference in its entirety. The aliasing module 110 is also referred to herein as a universal frequency translator (UFT) module.

Aliasing system 100 optionally includes one or more of an input impedance match module 118, a parallel resonant tank module 120, and an output impedance match module 122, as disclosed in the '551 patent.

Aliasing system 100 optionally includes a local oscillator (LO) impedance match module 124 for impedance matching a local oscillator input (LO$_{in}$) signal 126, generated by a local oscillator 128, to the aliasing module 110. The LO impedance match module 124 can be designed to increase the voltage of the LO$_{in}$ signal 126, as illustrated by a higher voltage LO$_{in}$ signal 130. The LO impedance match module 124 permits the aliasing system 100 to efficiently operate with a relatively low voltage LO$_{in}$ signal 126, without the use of power consuming amplifiers that would otherwise be necessary to increase the amplitude of the LO$_{in}$ signal 126.

Unless otherwise noted, the aliasing signal 114 is used interchangeably herein to refer to the LO$_{in}$ signal 126 and/or the higher voltage LO$_{in}$ signal 130.

The aliasing system 100 optionally includes a DC block 132 that substantially blocks DC while passing substantially all non-DC. In the exemplary embodiment, the DC block 132 is a DC blocking capacitor 133. A variety of implementations of the DC block 132 suitable for the present invention are available as will be apparent to persons skilled in the relevant art, based on the teachings herein.

The aliasing system 100 optionally includes a bias module 134 for biasing the aliasing signal 114. A variety of implementations of the biasing module 134 suitable for the present invention are available as will be apparent to persons skilled in the relevant art, based on the teachings herein.

FIG. 2 illustrates an exemplary schematic diagram 202 that can be used to implement the aliasing system 100. The exemplary schematic diagram 202 provides exemplary circuit elements that can be used within the optional input impedance match module 118, the optional parallel resonant tank 120, the optional output impedance match module 122, the optional LO impedance match module, the optional DC block 132, and the optional bias module 134. The invention is not limited to the exemplary embodiment of FIG. 2.

The exemplary schematic diagram 202 includes a storage module 210 for storing energy transferred from the EM signal 112, as disclosed in the '551 patent.

In the schematic diagram 202, the aliasing module 110 of FIG. 1 is illustrated as an application specific integrated circuit (ASIC) 212. In an embodiment, the ASIC is implemented in complementary metal oxide semiconductor (CMOS).

The ASIC 212 is coupled to a first voltage source 218 for supplying power circuits within the ASIC 212. The circuits within the ASIC 212 are described below with reference to FIG. 3. An optional first bypass module 220 is optionally disposed as illustrated to substantially eliminate unwanted frequencies from the first power supply 218 and from the ASIC 212.

The ASIC 212 includes a substrate (not shown) which is optionally coupled to a second voltage source 214. An advantage of coupling the substrate to the second voltage source 214 is described below with reference to FIG. 3. When the substrate is coupled to the second voltage source 214, an optional second bypass module 216 is optionally disposed as illustrated to substantially eliminate unwanted frequencies from the substrate and the second voltage source 214.

FIG. 3 illustrates an aliasing module 302, which is an exemplary embodiment of the aliasing module 110 and the ASIC 212. The aliasing module 302 includes a sine wave to square wave converter module 310, a pulse shaper module 312 and a switch module 314. The sine wave to square wave converter module 310 converts a sine wave 114 from the local oscillator 128 to a square wave 311. The pulse shaper module 312 receives the square wave 311 and generates energy transfer pulses 313 therefrom. Energy transfer pulses are discussed in greater detail in the '551 patent.

In an embodiment, the pulse shaper module 312 is implemented as a mono-stable multi-state vibrator. A variety of implementations of the pulse shaper module 312 suitable for the present invention are available as will be apparent to persons skilled in the relevant art, based on the teachings herein.

Generally, the frequency of the energy transfer pulses 311 is determined by the frequency of the aliasing signal 114 and the width or aperture of the energy transfer pulses is determined by the pulse shaper module 312.

In the illustrated embodiment, where the sine wave to square wave converter module 310 and the pulse shaper module 312 are provided on-chip, the ASIC substrate (not shown) is optionally coupled to the second power supply 214. The second power supply 214 can be varied to affect the performance of the circuits on the ASIC 212, with a result of effectively adjusting the pulse width of the energy transfer pulses 313.

In an alternative embodiment, the sine wave to square wave converter module 310 and/or the pulse shaper module 312 are provided off-chip.

An advantage of the ultra-low power down-converter aliasing system 100 is its low power consumption. For example, in an actual implementation, the aliasing module 302 required an average of approximately 1 mA and consumed approximately 3 to 5 mWatt. This is significantly greater performance than conventional down converter systems.

Other advantages of the ultra-low power down-converter aliasing system 100 include tuning reduction, parts reduction, price reduction, size reduction, performance increase, low frequency and power LO, and excellent linearity. Another advantage of the ultra-low power down-converter aliasing system is that it can down-convert EM signals as high as 3.5 GHz when implemented in CMOS. Higher frequencies can be down-converted using other materials such as gallium arsenide (GaAs), for example.

In an embodiment, an ultra-low power down-converter as described above is implemented in an FRS.

High Efficiency Transmitter

This section describes the high-efficiency transmitter embodiment of a frequency up-converter for use in a family radio service unit. It describes methods and systems related to a transmitter. Structural exemplary embodiments for achieving these methods and systems are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The present invention has significant advantages over conventional transmitters. These advantages include, but are not limited to, a reduction in the number of parts to accomplish the transmitter function, a reduction in the power requirements for the circuit, and a reduction of cost and complexity by permitting the use of circuits designed for lower frequency applications, including, but not limited to, lower frequency oscillators.

Figure 8:
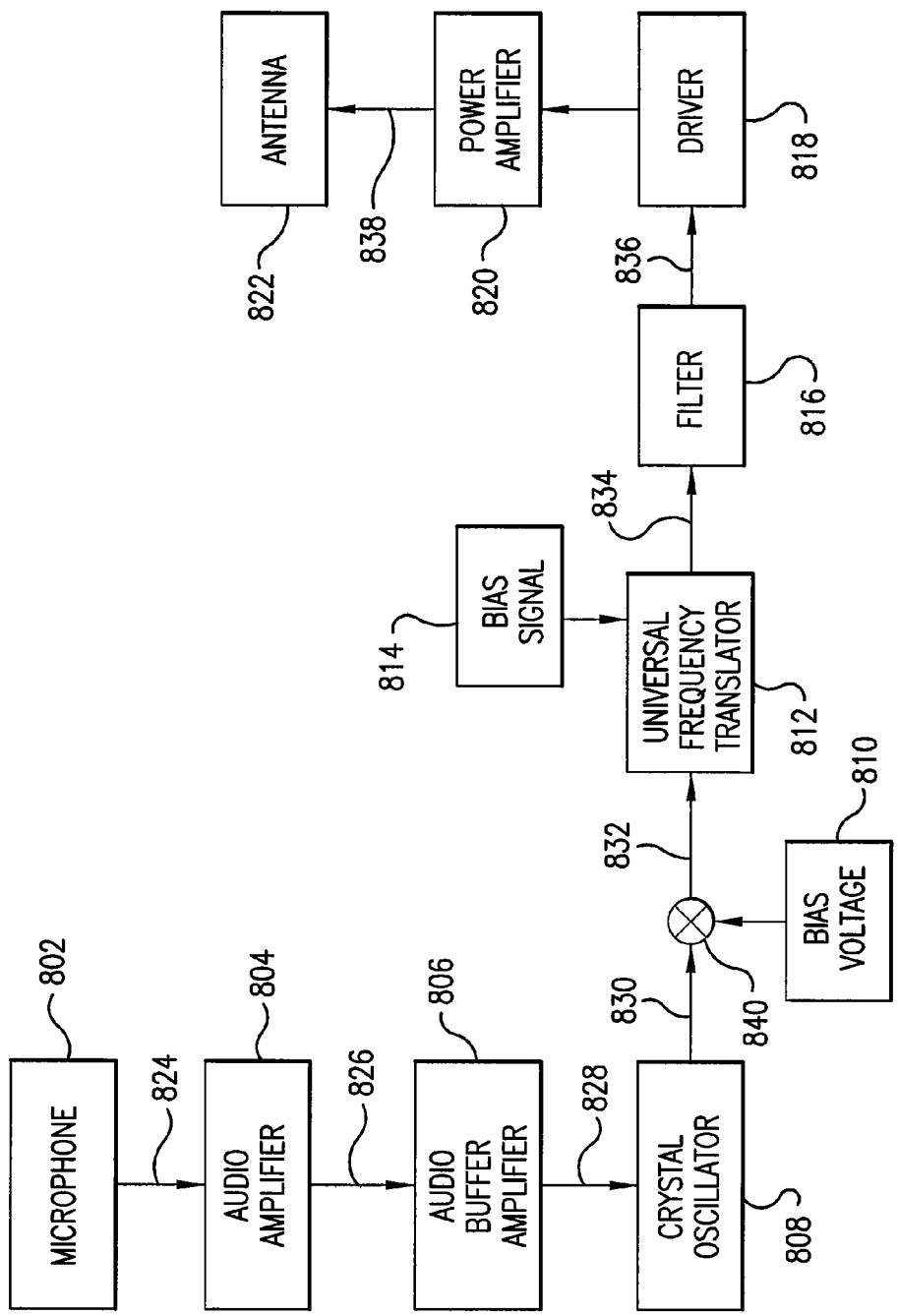
FIG. 8 is a block diagram of a system for transmitting a voice signal, in accordance with an aspect of the present invention.

An embodiment for transmitting a voice signal is shown in FIG. 8. The voice signal is input to a microphone 802. The output of microphone 802 is an analog voice signal 824 which is connected to an audio amplifier 804. The output of audio amplifier 804 is an amplified signal 826 which is filtered by an audio buffer amplifier 806. Audio buffer amplifier 806 acts as a low pass filter to eliminate unwanted higher frequency signals. The output of audio buffer amplifier 806 is a signal 828 which is accepted by crystal oscillator 808. Crystal oscillator 808 operates as a voltage controlled oscillator and outputs a frequency modulated (FM) signal 830 that is a sinusoidal signal biased substantially around zero volts.

At a node 840, a bias voltage 810 combines with FM signal 830. For the implementation wherein bias voltage 810 is a positive voltage, the bias point of FM signal 830 is raised such that substantially the entire waveform is above zero. In an alternate implementation wherein bias voltage 810 is negative, the bias point of FM signal 830 is lowered such that substantially all of the waveform is below zero. This combination of FM signal 830 and bias voltage 810 results in an FM control signal 832. Substantially all of FM control signal 832 is above zero (or below zero if bias voltage 810 is negative). FM control signal 832 is then input to a universal frequency translator (UFT) module 812.

UFT module 812 is comprised of a pulse shaping circuit and a switch, and is described in detail below in FIG. 9. The output of UFT module 812 is a rectangular waveform 834 that contains a plurality of harmonics. Rectangular waveform 834 is accepted by a filter 816 which filters out the undesired harmonic frequencies and outputs a desired output signal 836. Desired output signal 836 is the frequency modulated signal at the desired output frequency. Desired output signal 836 goes to a driver 818 and then to a power amplifier 820. The output of power amplifier 820 is an amplified output signal 838. Amplified output signal 838 is ready for transmission and is routed to an antenna 822.

Figure 9:
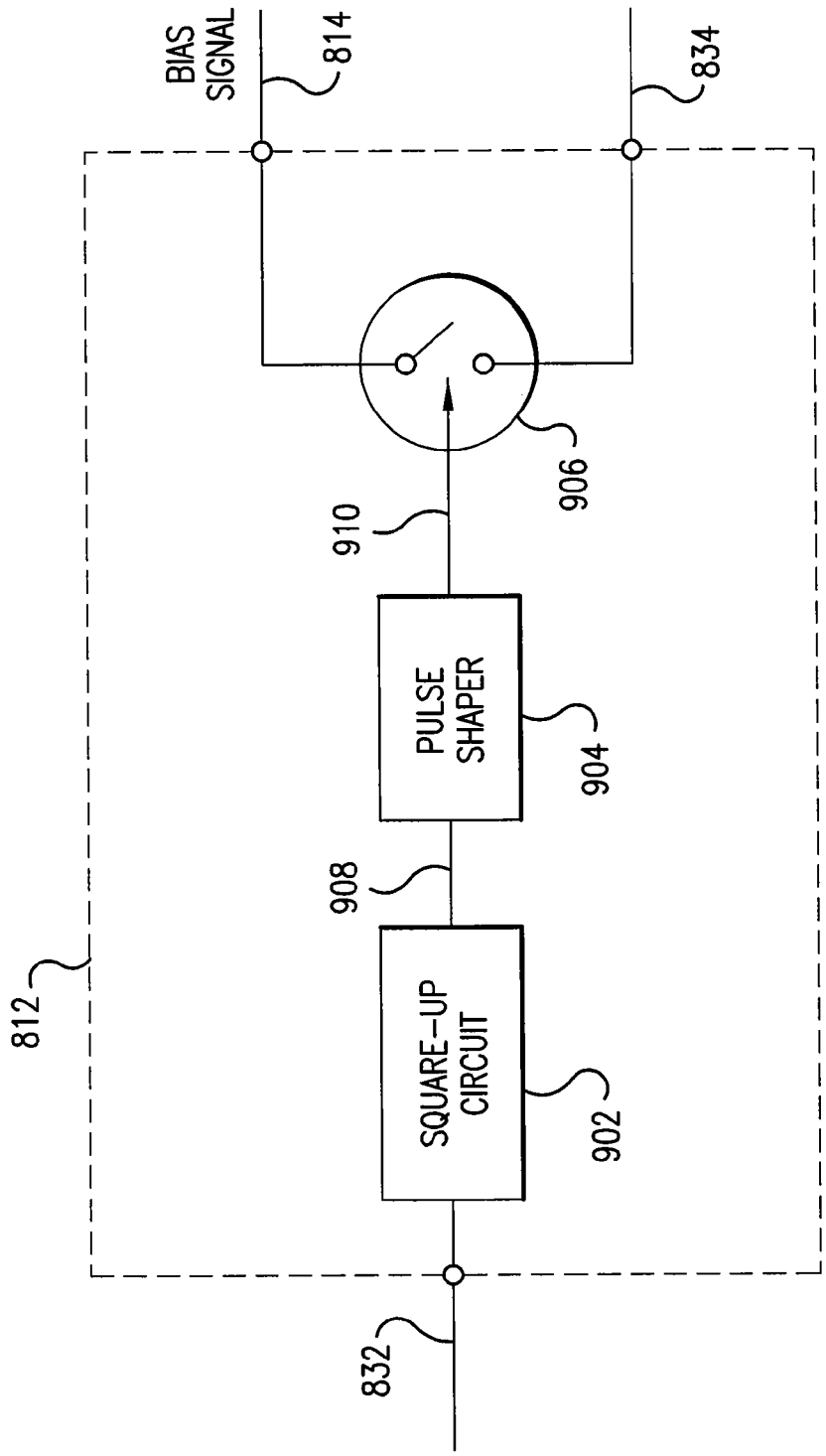
FIG. 9 is block diagram of a Universal Frequency Translator (UFT) in accordance with an aspect of the present invention.

The design of UFT module 812 is shown in FIG. 9. FM control signal 832 is accepted by a "square-up" circuit 902 to create a frequency modulated square wave 908 from the sinusoidal waveform of FM control signal 832. FM square wave 908 is then routed to a pulse shaper 904 to create a string of pulses 910. In one embodiment, pulse shaper 904 is a mono-stable multi-vibrator. The string of pulses 910 operates a switch 906 which creates rectangular waveform 834. Typically, pulse shaper 904 is designed such that each pulse in string of pulses 910 has a pulse width "τ" that is substantially equal to (n/2)·T, where "T" is the period of desired output signal 836, and "n" is any odd number. As stated previously, switch 906 outputs rectangular waveform 834, which is then routed to filter 816 of FIG. 8. Another input to UFT module 812 is a bias signal 814, which, in this embodiment, is connected to the opposite terminal of switch 906 from rectangular waveform 834.

Figure 11:
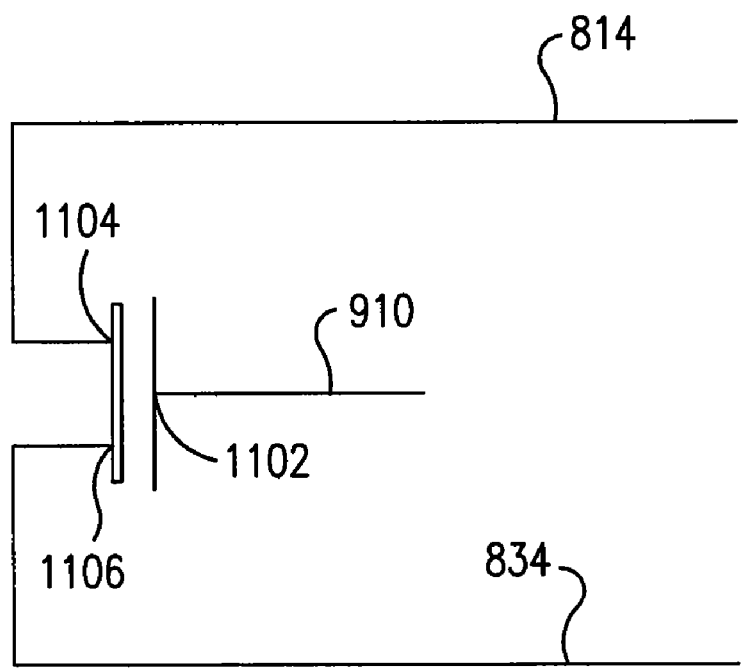
FIG. 11 illustrates a field effect transistor (FET) that can be used by the present invention.

In one implementation of the invention, switch 906 is a field effect transistor (FET). A specific implementation wherein the FET is a complementary metal oxide semiconductor (CMOS) FET is shown in FIG. 11. A CMOS FET has three terminals: a gate 1102, a source 1104, and a drain 1106. String of pulses 910 is shown at gate 1102, bias signal 814 is shown at source 1104, and rectangular waveform 834 is shown at drain 1106. Those skilled in the relevant art(s) will appreciate that the source and drain of a FET are interchangeable, and that bias signal 814 could bee at the drain 1106, with rectangular waveform 834 being at the source 1104. Numerous circuit designs are available to eliminate any possible asymmetry, and an example of such a circuit may be found in U.S. Pat. No. 6,091,940, entitled "Method and System for Frequency Up-Conversion," the full disclosure of which is incorporated herein by reference.

Figure 10:
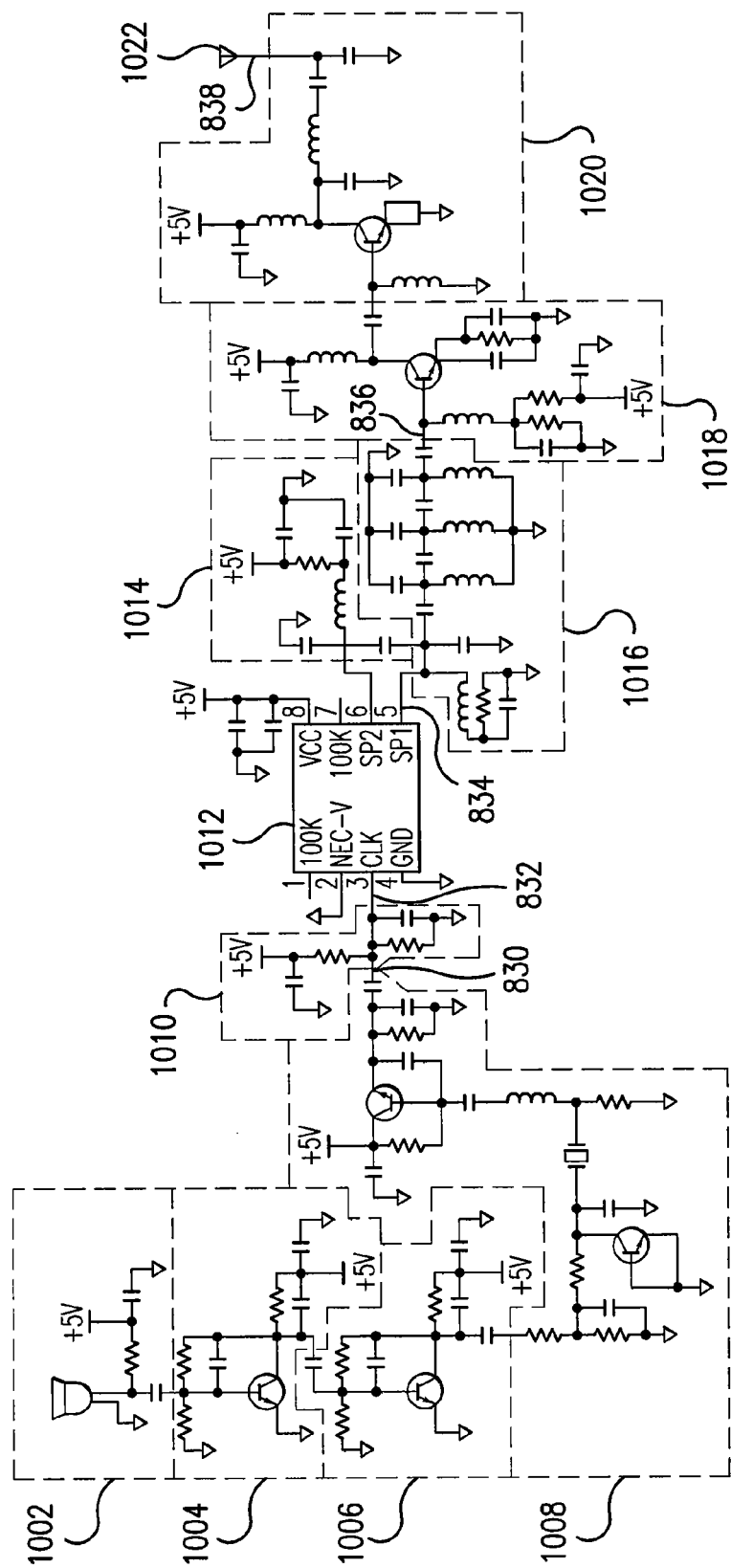
FIG. 10 is a schematic diagram of an exemplary implementation of the system for transmitting a voice signal illustrated in FIG. 8.

FIG. 10 is a detailed schematic drawing of the embodiment described above. Those skilled in the relevant art(s) will appreciated that numerous circuit designs can be used, and that FIG. 10 is shown for illustrative purposes only, and is not limiting. In addition, there are a variety of commercially available components and assemblies suitable for use in the present invention (e.g., audio amplifiers, audio buffer amplifiers, crystal oscillators, drivers, and power amplifiers) as will be apparent to those skilled in the relevant art(s) based on the teachings contained herein.

Microphone 802 of FIG. 8 is shown as a microphone 1002 in FIG. 10. The output of microphone 1002 is a voice signal which is routed to an audio amplifier 1004 and then to an audio buffer amplifier 1006. A crystal oscillator 1008 is driven by the output of audio buffer amplifier 1006 to create the FM signal 830. A bias voltage 1010 combines with FM signal 830 to create the FM control signal 832. FM control signal 832 is routed to a UFT module 1012 which creates rectangular signal 834. Also connected to UFT 1012 is a bias signal 1012. Rectangular signal 834 is filtered by a filter 1016 to remove the unwanted harmonics and results in desired output signal 836. Desired output signal 836 goes to a driver 1018 and then to a power amplifier 1020. The output of power amplifier 1020 is amplified output signal 838. Amplified output signal 838 is ready for transmission and is routed to an antenna 1022.

In the above implementation, looking back to FIG. 8, the frequency of FM control signal 832 is a sub-harmonic of the frequency of desired output signal 836. It will be understood by those skilled in the relevant art(s) that the selection of the frequencies will have an impact on the amplitude of the desired output signal 836, and will be a determinative factor as to whether or not driver 818 and/or power amplifier 820 will be needed. Similarly, those skilled in the relevant art(s) will understand that the selection of microphone 802 will have an effect on analog voice signal 824, and will be a determinative factor as to whether or not audio amplifier 804 and/or audio buffer amplifier 806 will be needed. Additionally, those skilled in the relevant art(s) will understand that the specific design of UFT 812 will be a determinative factor as to whether or not bias voltage 810 is needed.

The invention described above is for an embodiment wherein the output of the microphone is described as an analog voice signal. Those skilled in the relevant art(s) will understand that the invention applies equally to a digital signal, either digital data or a voice signal that has been digitized.

Transceiver

The inventions described above can be implemented individually. Alternatively, two or more of the inventions described above can be implemented in combination with one another. For example, one or both of the ultra-low power down-converter and zero IF FM decoder an be implemented with the high efficiency transmitter described above, as a transceiver. Also, one or both of the ultra-low power down-converter and zero IF FM decoder dan be implemented with a transmitter designed in accordance with the disclosure provided in U.S. Pat. No. 6,091,940, titled, "Method and System for Frequency Up-Conversion," incorporated herein by reference in its entirety.

In an embodiment, a transceiver as described above is implemented as a FRS transceiver.

What is claimed is:

1. A method for down-converting a frequency modulated (FM) signal, comprising the steps of:
   (1) aliasing the FM signal at an aliasing rate with a first local oscillator (LO) signal and a second LO signal, said aliasing rate being determined by the frequency of the FM signal, and wherein said second LO signal is phase shifted relative to said first LO signal;

(2) adjusting said aliasing rate to compensate for frequency changes of the FM signal; and (3) outputting, responsive to steps (1) and (2), a demodulated baseband information signal, wherein the aliasing rate is adjusted based upon the demodulated baseband information signal.

2. The method of claim 1, wherein step (1) comprises:

aliasing the FM signal at an aliasing rate that is substantially equal to a sub-harmonic of a frequency of the FM signal.

3. The method of claim 1, wherein step (1) comprises:

aliasing the FM signal at an aliasing rate that is substantially equal to a frequency of the FM signal.

4. The method of claim 1, further comprising the step of:

compensating for phase delays to maintain bandwidth and stability.

5. The method of claim 1, wherein the FM signal has a frequency substantially equal to a Family Radio Service frequency.

6. A method for directly down-converting a frequency modulated (FM) signal having a carrier frequency, comprising the steps of:

(1) aliasing the FM signal with a first local oscillator (LO) signal to create a first down-converted signal, said first LO signal having a first LO frequency and a first LO phase;

(2) aliasing the FM signal with a second LO signal to create a second down-converted signal, said second LO signal having a second LO frequency and a second LO phase, wherein said second LO frequency is substantially the same as said first LO frequency, and wherein said second LO phase is shifted relative to said first LO phase;

(3) combining said first down-converted signal and said second down-converted signal to create a summation signal;

(4) integrating said summation signal to create a control signal;

(5) generating said first and second LO signals based on said control signal; and (6) outputting said control signal as a demodulated baseband information signal, wherein said first LO frequency and said second LO frequency are based on the demodulated baseband information signal.

7. The method of claim 6, wherein said second LO phase is shifted relative to said first LO phase by an amount that is substantially equal to one-quarter period of the FM signal.

8. The method of claim 6, wherein said second LO phase is shifted relative to said first LO phase by an amount that is substantially equal to any multiple of a period of the FM signal plus one-quarter period of the FM signal.

9. The method of claim 6, wherein step (5) comprises:

(a) compensating for phase delays to maintain stability by adjusting said control signal to create a compensated control signal; and (b) creating said first and second LO signals using said compensated control signal.

10. The method of claim 6, wherein said first and second LO signals are substantially equal to a sub-harmonic of the carrier frequency of the FM signal.

11. The method of claim 6, wherein said first and second LO signals are substantially equal to the carrier frequency of the FM signal.

12. A system for down-converting a frequency modulated (FM) signal having a carrier frequency, comprising:

a first aliasing module to alias the FM signal with a first local oscillating (LO) signal, said first LO signal having a first LO signal frequency and a first LO signal phase, said first LO signal frequency being a function of an aliasing rate, and said first aliasing module outputting a first down-converted signal;

a second aliasing module to alias the FM signal with a second LO signal, said second LO signal having a second LO signal frequency and a second LO signal phase, wherein said second LO signal frequency is substantially equal to said first LO signal frequency and said second LO signal phase is shifted relative to said first LO signal phase, said second aliasing module outputting a second down-converted signal;

a summing module to combine said first down-converted signal and said second down-converted signal to create a summation signal;

an integration module to integrate said summation signal and create a control signal;

a voltage controlled oscillator to accept said control signal and to output an aliasing signal, wherein said aliasing signal determines said aliasing rate; and wherein said control signal is a demodulated baseband information signal.

13. The system of claim 12, wherein said aliasing rate is determined by the carrier frequency of the FM signal.

14. The system of claim 13, wherein said aliasing rate is substantially equal to a sub-harmonic of the carrier frequency of the FM signal.

15. The system of claim 13, wherein said aliasing rate is substantially equal to the carrier frequency of the FM signal.

16. The system of claim 12, further comprising a compensation module that accepts said control signal and that outputs a compensated control signal, and wherein said voltage controlled oscillator accepts said compensated control signal.

17. The system of claim 16, wherein said compensation module compensates for phase delays to maintain bandwidth and stability.

18. The system of claim 12, wherein the carrier frequency of the FM signal is at a frequency substantially equal to a Family Radio Service frequency.

19. A method for down-converting a frequency modulated (FM) signal, comprising the steps of:

(1) aliasing the FM signal with a first local oscillator (LO) signal to create a first down-converted signal;

(2) aliasing the FM signal with a second LO signal to create a second down-converted signal;

(3) generating a control signal from said first and second down-converted signals, wherein aliasing rates of said first and second LO signals are generated from said control signal; and (4) adjusting said control signal based on frequency changes of the FM signal.

20. The method of claim 19, wherein step (3) comprises the step of:

(a) summing said first and second down-converted signals to generate a summation signal; and (b) integrating said summation signal to generate said control signal wherein said first and second LO signals are generated from said control signal.

21. The method of claim 20, wherein step (4) comprises the step of:

adjusting said control signal to maintain said summation signal at a value substantially equal to zero.

22. The method of claim 19, further comprising the step of:

maintaining said first and second LO signals such that one of said first and second LO signals leads the FM signal, and another of said first and second LO signals lags the FM signal.

23. A down-converter to down-convert a frequency modulated (FM) signal, comprising:

a first aliasing module to receive the FM signal and a first local oscillator (LO) signal, wherein said first aliasing module creates a first down-converted signal;

a second aliasing module to receive the FM signal and a second LO signal, wherein said second aliasing module creates a second down-converted signal;

a tracking module to track changes in frequency of the FM signal; and an LO signal changing module to change said first and second LO signals based on said changes in frequency.

24. The down-converter of claim 23, wherein said tracking module comprises:

a summer that sums said first and second down-converted signals to generate a summation signal; and an integrator that integrates said summation signal to generate a control signal.

25. The down-converter of claim 24, wherein said LO signal changing module comprises:

a voltage controlled oscillator that modifies said first and second LO signals based on said control signal.

* * * * *

UNITED STATES PATENT AND TRADEMARK OFFICE
CERTIFICATE OF CORRECTION

PATENT NO.         : 7,209,725 B1
APPLICATION NO. : 09/476092
DATED                 : April 24, 2007
INVENTOR(S)      : Sorrells et al.

It is certified that error appears in the above-identified patent and that said Letters Patent is hereby corrected as shown below:

Title Page, Item [56], U.S. PATENT DOCUMENTS Section
Please add the following references:

| | | |
|---|---|---|
| 2,057,613 | 10/1936 | Gardner |
| 2,241,078 | 05/1941 | Vreeland |
| 2,270,385 | 01/1942 | Skillman |
| 2,283,575 | 05/1942 | Roberts |
| 2,358,152 | 09/1944 | Earp |
| 2,410,350 | 10/1946 | Labin et al. |
| 2,451,430 | 10/1948 | Barone |
| 2,462,069 | 02/1949 | Chatterjea et al. |
| 2,462,181 | 02/1949 | Grosselfinger |
| 2,472,798 | 06/1949 | Fredendall |
| 2,497,859 | 02/1950 | Boughtwood et al. |
| 2,499,279 | 02/1950 | Peterson |
| 2,530,824 | 11/1950 | King |
| 2,802,208 | 08/1957 | Hobbs |
| 2,985,875 | 05/1961 | Grisdale et al. |
| 3,023,309 | 02/1962 | Foulkes |
| 3,069,679 | 12/1962 | Sweeney et al. |
| 3,104,393 | 09/1963 | Vogelman |
| 3,114,106 | 12/1963 | McManus |
| 3,118,117 | 01/1964 | King et al. |
| 3,226,643 | 12/1965 | McNair |
| 3,258,694 | 06/1966 | Shepherd |
| 3,383,598 | 05/1968 | Sanders |
| 3,384,822 | 05/1968 | Miyagi |
| 3,454,718 | 07/1969 | Perreault |
| 3,523,291 | 08/1970 | Pierret |
| 3,548,342 | 12/1970 | Maxey |
| 3,555,428 | 01/1971 | Perreault |
| 3,614,627 | 10/1971 | Runyan et al. |
| 3,617,892 | 11/1971 | Hawley et al. |
| 3,617,898 | 11/1971 | Janning, Jr. |
| 3,621,402 | 11/1971 | Gardner |
| 3,623,160 | 11/1971 | Giles et al. |
| 3,626,417 | 12/1971 | Gilbert |
| 3,629,696 | 12/1971 | Bartelink |
| 3,641,442 | 02/1972 | Boucher |
| 3,662,268 | 05/1972 | Gans et al. |
| 3,689,841 | 09/1972 | Bello et al. |

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 3,694,754 | 09/1972 | Baltzer |
| 3,714,577 | 01/1973 | Hayes |
| 3,716,730 | 02/1973 | Cerny, Jr. |
| 3,717,844 | 02/1973 | Barret et al. |
| 3,719,903 | 03/1973 | Goodson |
| 3,735,048 | 05/1973 | Tomsa et al. |
| 3,737,778 | 06/1973 | Van Gerwen *et al.* |
| 3,739,282 | 06/1973 | Bruch *et al.* |
| 3,764,921 | 10/1973 | Huard |
| 3,806,811 | 04/1974 | Thompson |
| 3,868,601 | 02/1975 | MacAfee |
| 3,940,697 | 02/1976 | Morgan |
| 3,949,300 | 04/1976 | Sadler |
| 3,967,202 | 06/1976 | Batz |
| 3,980,945 | 09/1976 | Bickford |
| 3,987,280 | 10/1976 | Bauer |
| 3,991,277 | 11/1976 | Hirata |
| 4,003,002 | 01/1977 | Snijders et al. |
| 4,013,966 | 03/1977 | Campbell |
| 4,016,366 | 04/1977 | Kurata |
| 4,017,798 | 04/1977 | Gordy et al. |
| 4,019,140 | 04/1977 | Swerdlow |
| 4,032,847 | 06/1977 | Unkauf |
| 4,035,732 | 07/1977 | Lohrmann |
| 4,045,740 | 08/1977 | Baker |
| 4,047,121 | 09/1977 | Campbell |
| 4,051,475 | 09/1977 | Campbell |
| 4,066,841 | 01/1978 | Young |
| 4,066,919 | 01/1978 | Huntington |
| 4,080,573 | 03/1978 | Howell |
| 4,081,748 | 03/1978 | Batz |
| 4,115,737 | 09/1978 | Hongu et al. |
| 4,130,765 | 12/1978 | Arakelian et al. |
| 4,130,806 | 12/1978 | Van Gerwen et al. |
| 4,142,155 | 02/1979 | Adachi |
| 4,143,322 | 03/1979 | Shimamura |
| 4,158,149 | 06/1979 | Otofuji |
| 4,170,764 | 10/1979 | Salz et al. |

UNITED STATES PATENT AND TRADEMARK OFFICE
CERTIFICATE OF CORRECTION

PATENT NO.        : 7,209,725 B1
APPLICATION NO.   : 09/476092
DATED             : April 24, 2007
INVENTOR(S)       : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 4,204,171 | 05/1980 | Sutphin, Jr. |
| 4,210,872 | 07/1980 | Gregorian |
| 4,241,451 | 12/1980 | Maixner et al. |
| 4,245,355 | 01/1981 | Pascoe et al. |
| 4,253,066 | 02/1981 | Fisher et al. |
| 4,253,067 | 02/1981 | Caples et al. |
| 4,253,069 | 02/1981 | Nossek |
| 4,286,283 | 08/1981 | Clemens |
| 4,308,614 | 12/1981 | Fisher et al. |
| 4,320,361 | 03/1982 | Kikkert |
| 4,320,536 | 03/1982 | Dietrich |
| 4,334,324 | 06/1982 | Hoover |
| 4,346,477 | 08/1982 | Gordy |
| 4,355,401 | 10/1982 | Ikoma et al. |
| 4,356,558 | 10/1982 | Owen et al. |
| 4,360,867 | 11/1982 | Gonda |
| 4,363,132 | 12/1982 | Collin |
| 4,365,217 | 12/1982 | Berger et al. |
| 4,369,522 | 01/1983 | Cerny, Jr. et al. |
| 4,370,572 | 01/1983 | Cosand et al. |
| 4,380,828 | 04/1983 | Moon |
| 4,389,579 | 06/1983 | Stein |
| 4,392,255 | 07/1983 | Del Giudice |
| 4,393,395 | 07/1983 | Hacke et al. |
| 4,430,629 | 02/1984 | Betzl et al. |
| 4,439,787 | 03/1984 | Mogi et al. |
| 4,446,438 | 05/1984 | Chang et al. |
| 4,456,990 | 06/1984 | Fisher et al. |
| 4,472,785 | 09/1984 | Kasuga |
| 4,479,226 | 10/1984 | Prabhu et al. |
| 4,481,490 | 11/1984 | Huntley |
| 4,481,642 | 11/1984 | Hanson |
| 4,484,143 | 11/1984 | French et al. |
| 4,485,488 | 11/1984 | Houdart |
| 4,504,803 | 03/1985 | Lee et al. |
| 4,517,519 | 05/1985 | Mukaiyama |
| 4,517,520 | 05/1985 | Ogawa |
| 4,518,935 | 05/1985 | van Roermund |

UNITED STATES PATENT AND TRADEMARK OFFICE
CERTIFICATE OF CORRECTION

PATENT NO.        : 7,209,725 B1
APPLICATION NO. : 09/476092
DATED             : April 24, 2007
INVENTOR(S)       : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| Patent No. | Date | Inventor |
|---|---|---|
| 4,521,892 | 06/1985 | Vance et al. |
| 4,562,414 | 12/1985 | Linder *et al.* |
| 4,577,157 | 03/1986 | Reed |
| 4,583,239 | 04/1986 | Vance |
| 4,591,736 | 05/1986 | Hirao et al. |
| 4,591,930 | 05/1986 | Baumeister |
| 4,563,773 | 07/1986 | Dixon, Jr. et al. |
| 4,602,220 | 07/1986 | Kurihara |
| 4,603,300 | 07/1986 | Welles, II et al. |
| 4,612,464 | 09/1986 | Ishikawa et al. |
| 4,612,518 | 09/1986 | Gans et al. |
| 4,616,191 | 10/1986 | Galani et al. |
| 4,621,217 | 11/1986 | Saxe et al. |
| 4,628,517 | 12/1986 | Schwarz et al. |
| 4,634,998 | 01/1987 | Crawford |
| 4,648,021 | 03/1987 | Alberkrack |
| 4,651,034 | 03/1987 | Sato |
| 4,653,117 | 03/1987 | Heck |
| 4,675,882 | 06/1987 | Lillie et al. |
| 4,688,253 | 08/1987 | Gumm |
| 4,716,376 | 12/1987 | Daudelin |
| 4,716,388 | 12/1987 | Jacobs |
| 4,718,113 | 01/1988 | Rother et al. |
| 4,726,041 | 02/1988 | Prohaska et al. |
| 4,733,403 | 03/1988 | Simone |
| 4,734,591 | 03/1988 | Ichitsubo |
| 4,737,969 | 04/1988 | Steel et al. |
| 4,740,675 | 04/1988 | Brosnan et al. |
| 4,740,792 | 04/1988 | Sagey *et al.* |
| 4,743,858 | 05/1988 | Everard |
| 4,745,463 | 05/1988 | Lu |
| 4,751,468 | 06/1988 | Agoston |
| 4,757,538 | 07/1988 | Zink |
| 4,768,187 | 08/1988 | Marshall |
| 4,769,612 | 09/1988 | Tamakoshi et al. |
| 4,785,463 | 11/1988 | Janc et al. |
| 4,789,837 | 12/1988 | Ridgers |
| 4,791,584 | 12/1988 | Greivenkamp, Jr. |

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 4,801,823 | 01/1989 | Yokoyama |
| 4,806,790 | 02/1989 | Sone |
| 4,810,904 | 03/1989 | Crawford |
| 4,810,976 | 03/1989 | Cowley et al. |
| 4,811,362 | 03/1989 | Yester, Jr. et al. |
| 4,811,422 | 03/1989 | Kahn |
| 4,814,649 | 03/1989 | Young |
| 4,816,704 | 03/1989 | Fiori, Jr. |
| 4,819,252 | 04/1989 | Christopher |
| 4,833,445 | 05/1989 | Buchele |
| 4,841,265 | 06/1989 | Watanabe et al. |
| 4,845,389 | 07/1989 | Pyndiah *et al.* |
| 4,855,894 | 08/1989 | Asahi et al. |
| 4,862,121 | 08/1989 | Hochschild et al. |
| 4,866,441 | 09/1989 | Conway *et al.* |
| 4,868,654 | 09/1989 | Juri et al. |
| 4,870,659 | 09/1989 | Oishi et al. |
| 4,871,987 | 10/1989 | Kawase |
| 4,885,587 | 12/1989 | Wiegand et al. |
| 4,885,671 | 12/1989 | Peil |
| 4,885,756 | 12/1989 | Fontanes et al. |
| 4,888,557 | 12/1989 | Puckette, IV et al. |
| 4,890,302 | 12/1989 | Muilwijk |
| 4,893,316 | 01/1990 | Janc et al. |
| 4,893,341 | 01/1990 | Gehring |
| 4,894,766 | 01/1990 | De Agro |
| 4,896,152 | 01/1990 | Tiemann |
| 4,902,979 | 02/1990 | Puckette, IV |
| 4,908,579 | 03/1990 | Tawfik et al. |
| 4,910,752 | 03/1990 | Yester, Jr. et al. |
| 4,914,405 | 04/1990 | Wells |
| 4,920,510 | 04/1990 | Senderowicz et al. |
| 4,922,452 | 05/1990 | Larsen et al. |
| 4,931,716 | 06/1990 | Jovanovic *et al.* |
| 4,931,921 | 06/1990 | Anderson |
| 4,943,974 | 07/1990 | Motamedi |
| 4,944,025 | 07/1990 | Gehring et al. |
| 4,955,079 | 09/1990 | Connerney et al. |

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 4,965,467 | 10/1990 | Bilterijst |
| 4,967,160 | 10/1990 | Quievy et al. |
| 4,970,703 | 11/1990 | Hariharan et al. |
| 4,982,353 | 01/1991 | Jacob et al. |
| 4,984,077 | 01/1991 | Uchida |
| 4,995,055 | 02/1991 | Weinberger et al. |
| 5,003,621 | 03/1991 | Gailus |
| 5,005,169 | 04/1991 | Bronder et al. |
| 5,006,810 | 04/1991 | Popescu |
| 5,010,585 | 04/1991 | Garcia |
| 5,014,130 | 05/1991 | Heister *et al.* |
| 5,014,304 | 05/1991 | Nicollini et al. |
| 5,015,963 | 05/1991 | Sutton |
| 5,017,924 | 05/1991 | Guiberteau et al. |
| 5,020,149 | 05/1991 | Hemmie |
| 5,020,154 | 05/1991 | Zierhut |
| 5,052,050 | 09/1991 | Collier et al. |
| 5,063,387 | 11/1991 | Mower |
| 5,065,409 | 11/1991 | Hughes et al. |
| 5,083,050 | 01/1992 | Vasile |
| 5,091,921 | 02/1992 | Minami |
| 5,095,533 | 03/1992 | Loper et al. |
| 5,095,536 | 03/1992 | Loper |
| 5,111,152 | 05/1992 | Makino |
| 5,113,094 | 05/1992 | Grace et al. |
| 5,113,129 | 05/1992 | Hughes |
| 5,115,409 | 05/1992 | Stepp |
| 5,122,765 | 06/1992 | Pataut |
| 5,124,592 | 06/1992 | Hagino |
| 5,126,682 | 06/1992 | Weinberg et al. |
| 5,131,014 | 07/1992 | White |
| 5,136,267 | 08/1992 | Cabot |
| 5,140,699 | 08/1992 | Kozak |
| 5,140,705 | 08/1992 | Kosuga |
| 5,150,124 | 09/1992 | Moore et al. |
| 5,151,661 | 09/1992 | Caldwell et al. |
| 5,159,710 | 10/1992 | Cusdin |
| 5,164,985 | 11/1992 | Nysen *et al.* |

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 5,170,414 | 12/1992 | Silvian |
| 5,172,019 | 12/1992 | Naylor *et al.* |
| 5,172,070 | 12/1992 | Hiraiwa et al. |
| 5,191,459 | 03/1993 | Thompson et al. |
| 5,204,642 | 04/1993 | Ashgar et al. |
| 5,212,827 | 05/1993 | Meszko et al. |
| 5,214,787 | 05/1993 | Karkota, Jr. |
| 5,220,583 | 06/1993 | Solomon |
| 5,220,680 | 06/1993 | Lee |
| 5,222,144 | 06/1993 | Whikehart |
| 5,230,097 | 07/1993 | Currie et al. |
| 5,239,686 | 08/1993 | Downey |
| 5,239,687 | 08/1993 | Chen |
| 5,241,561 | 08/1993 | Barnard |
| 5,249,203 | 09/1993 | Loper |
| 5,251,218 | 10/1993 | Stone et al. |
| 5,251,232 | 10/1993 | Nonami |
| 5,260,970 | 11/1993 | Henry et al. |
| 5,263,194 | 11/1993 | Ragan |
| 5,263,196 | 11/1993 | Jasper |
| 5,263,198 | 11/1993 | Geddes *et al.* |
| 5,267,023 | 11/1993 | Kawasaki |
| 5,278,826 | 01/1994 | Murphy et al. |
| 5,282,023 | 01/1994 | Scarpa |
| 5,287,516 | 02/1994 | Schaub |
| 5,293,398 | 03/1994 | Hamao et al. |
| 5,303,417 | 04/1994 | Laws |
| 5,307,517 | 04/1994 | Rich |
| 5,315,583 | 05/1994 | Murphy et al. |
| 5,319,799 | 06/1994 | Morita |
| 5,321,852 | 06/1994 | Seong |
| 5,325,204 | 06/1994 | Scarpa |
| 5,337,014 | 08/1994 | Najle et al. |
| 5,339,054 | 08/1994 | Taguchi |
| 5,339,459 | 08/1994 | Schiltz et al. |
| 5,353,306 | 10/1994 | Yamamoto |
| 5,355,114 | 10/1994 | Sutterlin et al. |
| 5,361,408 | 11/1994 | Watanabe et al. |

UNITED STATES PATENT AND TRADEMARK OFFICE
CERTIFICATE OF CORRECTION

PATENT NO.       : 7,209,725 B1
APPLICATION NO.  : 09/476092
DATED            : April 24, 2007
INVENTOR(S)      : Sorrells et al.

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 5,369,404 | 11/1994 | Galton |
| 5,369,800 | 11/1994 | Takagi et al. |
| 5,375,146 | 12/1994 | Chalmers |
| 5,379,040 | 01/1995 | Mizomoto et al. |
| 5,379,141 | 01/1995 | Thompson et al. |
| 5,388,063 | 02/1995 | Takatori et al. |
| 5,390,215 | 02/1995 | Anita *et al.* |
| 5,390,364 | 02/1995 | Webster et al. |
| 5,400,084 | 03/1995 | Scarpa |
| 5,404,127 | 04/1995 | Lee et al. |
| 5,410,541 | 04/1995 | Hotto |
| 5,410,743 | 04/1995 | Seely et al. |
| 5,412,352 | 05/1995 | Graham |
| 5,416,803 | 05/1995 | Janer |
| 5,422,913 | 06/1995 | Wilkinson |
| 5,423,082 | 06/1995 | Cygan et al. |
| 5,428,638 | 06/1995 | Cioffi et al. |
| 5,428,640 | 06/1995 | Townley |
| 5,434,546 | 07/1995 | Palmer |
| 5,438,692 | 08/1995 | Mohindra |
| 5,444,415 | 08/1995 | Dent et al. |
| 5,444,416 | 08/1995 | Ishikawa et al. |
| 5,444,865 | 08/1995 | Heck et al. |
| 5,446,421 | 08/1995 | Kechkaylo |
| 5,446,422 | 08/1995 | Mattila et al. |
| 5,448,602 | 09/1995 | Ohmori et al. |
| 5,451,899 | 09/1995 | Lawton |
| 5,454,007 | 09/1995 | Dutta |
| 5,454,009 | 09/1995 | Fruit et al. |
| 5,463,356 | 10/1995 | Palmer |
| 5,463,357 | 10/1995 | Hobden |
| 5,465,071 | 11/1995 | Kobayashi et al. |
| 5,465,410 | 11/1995 | Hiben et al. |
| 5,465,415 | 11/1995 | Bien |
| 5,465,418 | 11/1995 | Zhou et al. |
| 5,471,162 | 11/1995 | McEwan |
| 5,479,120 | 12/1995 | McEwan |
| 5,479,447 | 12/1995 | Chow et al. |

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 5,483,193 | 01/1996 | Kennedy et al. |
| 5,483,549 | 01/1996 | Weinberg et al. |
| 5,483,600 | 01/1996 | Werrbach |
| 5,483,691 | 01/1996 | Heck et al. |
| 5,490,173 | 02/1996 | Whikehart et al. |
| 5,493,581 | 02/1996 | Young et al. |
| 5,493,721 | 02/1996 | Reis |
| 5,495,200 | 02/1996 | Kwan et al. |
| 5,495,202 | 02/1996 | Hsu |
| 5,495,500 | 02/1996 | Jovanovich et al. |
| 5,499,267 | 03/1996 | Ohe et al. |
| 5,500,758 | 03/1996 | Thompson et al. |
| 5,513,389 | 04/1996 | Reeser et al. |
| 5,515,014 | 05/1996 | Troutman |
| 5,517,688 | 05/1996 | Fajen et al. |
| 5,519,890 | 05/1996 | Pinckley |
| 5,523,719 | 06/1996 | Longo et al. |
| 5,523,726 | 06/1996 | Kroeger et al. |
| 5,523,760 | 06/1996 | McEwan |
| 5,535,402 | 07/1996 | Leibowitz *et al.* |
| 5,539,770 | 07/1996 | Ishigaki |
| 5,551,076 | 08/1996 | Bonn |
| 5,552,789 | 09/1996 | Schuermann |
| 5,555,453 | 09/1996 | Kajimoto et al. |
| 5,557,641 | 09/1996 | Weinberg |
| 5,557,642 | 09/1996 | Williams |
| 5,563,550 | 10/1996 | Toth |
| 5,574,755 | 11/1996 | Persico |
| 5,579,341 | 11/1996 | Smith et al. |
| 5,579,347 | 11/1996 | Lindquist et al. |
| 5,584,068 | 12/1996 | Mohindra |
| 5,592,131 | 01/1997 | Labreche et al. |
| 5,602,847 | 02/1997 | Pagano et al. |
| 5,602,868 | 02/1997 | Wilson |
| 5,604,592 | 02/1997 | Kotidis et al. |
| 5,604,732 | 02/1997 | Kim et al. |
| 5,608,531 | 03/1997 | Honda et al. |
| 5,610,946 | 03/1997 | Tanaka et al. |

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], U.S. PATENT DOCUMENTS Section (cont'd)
Please add the following references:

| | | |
|---|---|---|
| 5,617,451 | 04/1997 | Mimura et al. |
| 5,619,538 | 04/1997 | Sempel et al. |
| 5,621,455 | 04/1997 | Rogers et al. |
| RE 35,494 | 04/1997 | Nicollini |
| 5,630,227 | 05/1997 | Bella et al. |
| 5,633,610 | 05/1997 | Maekawa et al. |
| 5,634,207 | 05/1997 | Yamaji et al. |
| 5,638,396 | 06/1997 | Klimek |
| 5,640,415 | 06/1997 | Pandula |
| 5,640,424 | 06/1997 | Banavong et al. |
| 5,640,428 | 06/1997 | Abe et al. |
| 5,640,698 | 06/1997 | Shen et al. |
| 5,642,071 | 06/1997 | Sevenhans et al. |
| 5,648,985 | 07/1997 | Bjerede et al. |
| 5,650,785 | 07/1997 | Rodal |
| 5,661,424 | 08/1997 | Tang |
| 5,663,878 | 09/1997 | Walker |
| 5,663,986 | 09/1997 | Striffler |
| 5,668,836 | 09/1997 | Smith et al. |
| 5,675,392 | 10/1997 | Nayebi et al. |
| 5,680,078 | 10/1997 | Ariie |
| 5,680,418 | 10/1997 | Croft et al. |
| 5,689,413 | 11/1997 | Jaramillo et al. |
| 5,694,096 | 12/1997 | Ushiroku et al. |
| 5,699,006 | 12/1997 | Zele et al. |
| 5,705,949 | 01/1998 | Alelyunas et al. |
| 5,705,955 | 01/1998 | Freeburg et al. |
| 5,710,992 | 01/1998 | Sawada et al. |
| 5,710,998 | 01/1998 | Opas |
| 5,714,910 | 02/1998 | Skoczen et al. |
| 5,715,281 | 02/1998 | Bly et al. |
| 5,721,514 | 02/1998 | Crockett et al. |
| 5,724,002 | 03/1998 | Hulick |
| 5,724,653 | 03/1998 | Baker et al. |
| 5,729,577 | 03/1998 | Chen |
| 5,729,829 | 03/1998 | Talwar et al. |
| 5,732,333 | 03/1998 | Cox et al. |
| 5,734,683 | 03/1998 | Hulkko et al. |

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 5,736,895 | 04/1998 | Yu et al. |
| 5,737,035 | 04/1998 | Rotzoll |
| 5,742,189 | 04/1998 | Yoshida et al. |
| 5,748,683 | 05/1998 | Smith et al. |
| 5,751,154 | 05/1998 | Tsugai |
| 5,757,870 | 05/1998 | Miya et al. |
| 5,760,645 | 06/1998 | Comte et al. |
| 5,764,087 | 06/1998 | Clark |
| 5,767,726 | 06/1998 | Wang |
| 5,768,118 | 06/1998 | Faulk et al. |
| 5,768,323 | 06/1998 | Kroeger et al. |
| 5,770,985 | 06/1998 | Ushiroku et al. |
| 5,771,442 | 06/1998 | Wang et al. |
| RE 35,829 | 06/1998 | Sanderford, Jr. |
| 5,777,692 | 07/1998 | Ghosh |
| 5,777,771 | 07/1998 | Smith |
| 5,778,022 | 07/1998 | Walley |
| 5,786,844 | 07/1998 | Rogers et al. |
| 5,790,587 | 08/1998 | Smith et al. |
| 5,793,801 | 08/1998 | Fertner |
| 5,793,817 | 08/1998 | Wilson |
| 5,793,818 | 08/1998 | Claydon et al. |
| 5,801,654 | 09/1998 | Traylor |
| 5,802,463 | 09/1998 | Zuckerman |
| 5,805,460 | 09/1998 | Greene *et al*. |
| 5,809,060 | 09/1998 | Cafarella et al. |
| 5,812,546 | 09/1998 | Zhou et al. |
| 5,818,582 | 10/1998 | Fernandez et al. |
| 5,818,869 | 10/1998 | Miya et al. |
| 5,825,254 | 10/1998 | Lee |
| 5,825,257 | 10/1998 | Klymyshyn *et al*. |
| 5,834,985 | 11/1998 | Sundegård |
| 5,834,987 | 11/1998 | Dent |
| 5,841,324 | 11/1998 | Williams |
| 5,841,811 | 11/1998 | Song |
| 5,844,449 | 12/1998 | Abeno et al. |
| 5,847,594 | 12/1998 | Mizuno |
| 5,859,878 | 01/1999 | Phillips et al. |

UNITED STATES PATENT AND TRADEMARK OFFICE
CERTIFICATE OF CORRECTION

PATENT NO.         : 7,209,725 B1
APPLICATION NO. : 09/476092
DATED                  : April 24, 2007
INVENTOR(S)       : Sorrells et al.

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 5,864,754 | 01/1999 | Hotto |
| 5,872,446 | 02/1999 | Cranford, Jr. et al. |
| 5,881,375 | 03/1999 | Bonds |
| 5,883,548 | 03/1999 | Assard et al. |
| 5,892,380 | 04/1999 | Quist |
| 5,894,239 | 04/1999 | Bonaccio et al. |
| 5,894,496 | 04/1999 | Jones |
| 5,896,562 | 04/1999 | Heinonen |
| 5,900,747 | 05/1999 | Brauns |
| 5,901,054 | 05/1999 | Leu et al. |
| 5,901,187 | 05/1999 | Iinuma |
| 5,901,344 | 05/1999 | Opas |
| 5,901,347 | 05/1999 | Chambers et al. |
| 5,901,348 | 05/1999 | Bang et al. |
| 5,901,349 | 05/1999 | Guegnaud et al. |
| 5,903,178 | 05/1999 | Miyatsuji et al. |
| 5,903,187 | 05/1999 | Claverie et al. |
| 5,903,196 | 05/1999 | Salvi et al. |
| 5,903,421 | 05/1999 | Furutani et al. |
| 5,903,553 | 05/1999 | Sakamoto et al. |
| 5,903,595 | 05/1999 | Suzuki |
| 5,903,609 | 05/1999 | Kool et al. |
| 5,903,827 | 05/1999 | Kennan et al. |
| 5,903,854 | 05/1999 | Abe et al. |
| 5,905,433 | 05/1999 | Wortham |
| 5,905,449 | 05/1999 | Tsubouchi et al. |
| 5,907,149 | 05/1999 | Marckini |
| 5,907,197 | 05/1999 | Faulk |
| 5,909,447 | 06/1999 | Cox et al. |
| 5,911,116 | 06/1999 | Nosswitz |
| 5,911,123 | 06/1999 | Shaffer et al. |
| 5,914,622 | 06/1999 | Inoue |
| 5,915,278 | 06/1999 | Mallick |
| 5,918,167 | 06/1999 | Tiller *et al.* |
| 5,920,199 | 07/1999 | Sauer |
| 5,933,467 | 08/1999 | Sehier et al. |
| 5,943,370 | 08/1999 | Smith |
| 5,952,895 | 09/1999 | McCune, Jr. et al. |

UNITED STATES PATENT AND TRADEMARK OFFICE
CERTIFICATE OF CORRECTION

PATENT NO.       : 7,209,725 B1
APPLICATION NO. : 09/476092
DATED            : April 24, 2007
INVENTOR(S)      : Sorrells et al.

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 5,953,642 | 09/1999 | Feldtkeller et al. |
| 5,959,850 | 09/1999 | Lim |
| 5,960,033 | 09/1999 | Shibano et al. |
| 5,986,600 | 11/1999 | McEwan |
| 5,994,689 | 11/1999 | Charrier |
| 6,011,435 | 01/2000 | Takeyabu et al. |
| 6,028,887 | 02/2000 | Harrison et al. |
| 6,034,566 | 03/2000 | Ohe |
| 6,041,073 | 03/2000 | Davidovici et al. |
| 6,054,889 | 04/2000 | Kobayashi |
| 6,057,714 | 05/2000 | Andrys *et al.* |
| 6,081,691 | 06/2000 | Renard et al. |
| 6,084,922 | 07/2000 | Zhou et al. |
| 6,121,819 | 09/2000 | Traylor |
| 6,125,271 | 09/2000 | Rowland et al. |
| 6,144,236 | 11/2000 | Vice et al. |
| 6,144,846 | 11/2000 | Durec |
| 6,147,340 | 11/2000 | Levy |
| 6,147,763 | 11/2000 | Steinlechner |
| 6,150,890 | 11/2000 | Damgaard et al. |
| 6,175,728 B1 | 01/2001 | Mitama |
| 6,211,718 B1 | 04/2001 | Souetinov |
| 6,212,369 B1 | 04/2001 | Avasarala |
| RE37,138 E | 04/2001 | Dent |
| 6,225,848 B1 | 05/2001 | Tilley et al. |
| 6,308,058 B1 | 10/2001 | Souetinov *et al.* |
| 6,313,685 B1 | 11/2001 | Rabii |
| 6,313,700 B1 | 11/2001 | Nishijima *et al.* |
| 6,321,073 B1 | 11/2001 | Luz et al. |
| 6,393,070 B1 | 05/2002 | Reber |
| 6,404,758 B1 | 06/2002 | Wang |
| 6,441,659 B1 | 08/2002 | Demone |
| 6,441,694 B1 | 08/2002 | Turcotte *et al.* |
| 6,445,726 B1 | 09/2002 | Gharpurey |
| 6,512,544 B1 | 01/2003 | Merrill *et al.* |
| 6,512,785 B1 | 01/2003 | Zhou *et al.* |
| 6,560,451 B1 | 05/2003 | Somayajula |
| 6,567,483 B1 | 05/2003 | Dent *et al.* |

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], U.S. PATENT DOCUMENTS Section</u> (cont'd)
Please add the following references:

| | | |
|---|---|---|
| 6,591,310 B1 | 07/2003 | Johnson |
| 6,628,328 B1 | 09/2003 | Yokouchi *et al.* |
| 6,633,194 B2 | 10/2003 | Arnborg *et al.* |
| 6,647,270 B1 | 11/2003 | Himmelstein |
| 6,741,650 B1 | 05/2004 | Painchaud *et al.* |
| 6,775,684 B1 | 08/2004 | Toyoyama *et al.* |
| 6,801,253 B1 | 10/2004 | Yonemoto *et al.* |
| 6,865,399 B2 | 03/2005 | Fujioka *et al.* |
| 6,873,836 B1 | 03/2005 | Sorrells *et al.* |
| 6,879,817 B1 | 04/2005 | Sorrells *et al.* |
| 6,892,057 B2 | 05/2005 | Nilsson |
| 6,909,739 B1 | 06/2005 | Eerola *et al.* |
| 6,910,015 B2 | 06/2005 | Kawai |
| 6,959,178 B2 | 10/2005 | Macedo *et al.* |
| 6,963,626 B1 | 11/2005 | Shaeffer *et al.* |
| 6,973,476 B1 | 12/2005 | Naden *et al.* |
| 6,975,848 B2 | 12/2005 | Rawlins *et al.* |
| 6,999,747 B2 | 02/2006 | Su |
| 7,006,805 B1 | 02/2006 | Sorrells *et al.* |
| 7,010,286 B2 | 03/2006 | Sorrells *et al.* |
| 7,010,559 B2 | 03/2006 | Rawlins *et al.* |
| 7,016,663 B2 | 03/2006 | Sorrells *et al.* |
| 7,027,786 B1 | 04/2006 | Smith *et al.* |
| 7,039,372 B1 | 05/2006 | Sorrells *et al.* |
| 7,050,058 B2 | 05/2006 | Sorrells *et al.* |
| 7,054,296 B1 | 05/2006 | Sorrells *et al.* |
| 7,065,162 B1 | 06/2006 | Sorrells *et al.* |
| 7,072,390 B1 | 07/2006 | Sorrells *et al.* |
| 7,072,427 B2 | 07/2006 | Rawlins *et al.* |
| 7,076,011 B2 | 07/2006 | Cook *et al.* |
| 7,082,171 B1 | 07/2006 | Johnson *et al.* |
| 7,085,335 B2 | 08/2006 | Rawlins *et al.* |
| 7,107,028 B2 | 09/2006 | Sorrells *et al.* |
| 7,110,435 B1 | 09/2006 | Sorrells *et al.* |
| 7,110,444 B1 | 09/2006 | Sorrells *et al.* |
| 2001/0036818 A1 | 11/2001 | Dobrovolny |
| 2002/0132642 A1 | 09/2002 | Hines *et al.* |
| 2003/0149579 A1 | 08/2003 | Begemann *et al.* |

UNITED STATES PATENT AND TRADEMARK OFFICE

CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], U.S. PATENT DOCUMENTS Section</u> (cont'd)
Please add the following references:
| | | |
|---|---|---|
| 2004/0125879 A1 | 07/2004 | Jaussi *et al.* |
| 2006/0039449 A1 | 02/2006 | Fontana *et al.* |

<u>Title Page, Item [56], FOREIGN PATENT DOCUMENTS Section</u>
Please add the following references:
| | | |
|---|---|---|
| DE 35 41 031 A1 | 05/1986 | DE |
| DE 42 37 692 C1 | 03/1994 | DE |
| DE 692 21 098 T2 | 01/1998 | DE |
| DE 197 35 798 C1 | 07/1998 | DE |
| DT 1936252 | 01/1971 | DT |
| EP 0 035 166 A1 | 09/1981 | EP |
| EP 0 099 265 A1 | 01/1984 | EP |
| EP 0 193 899 B1 | 06/1990 | EP |
| EP 0 380 351 A2 | 08/1990 | EP |
| EP 0 380 351 A3 | 02/1991 | EP |
| EP 0 411 840 A2 | 02/1991 | EP |
| EP 0 411 840 A3 | 07/1991 | EP |
| EP 0 411 840 B1 | 10/1995 | EP |
| EP 0 423 718 A2 | 04/1991 | EP |
| EP 0 423 718 A3 | 08/1992 | EP |
| EP 0 486 095 A1 | 05/1992 | EP |
| EP 0 512 748 A2 | 11/1992 | EP |
| EP 0 529 836 A1 | 03/1993 | EP |
| EP 0 548 542 A1 | 06/1993 | EP |
| EP 0 512 748 A3 | 07/1993 | EP |
| EP 0 560 228 A1 | 09/1993 | EP |
| EP 0 632 288 A2 | 01/1995 | EP |
| EP 0 643 477 A2 & A3 | 03/1995 | EP |
| EP 0 486 095 B1 | 02/1997 | EP |
| EP 0 512 748 B1 | 11/1998 | EP |
| EP 0 632 288 A3 | 07/1996 | EP |
| EP 0 696 854 A1 | 02/1996 | EP |
| EP 0 732 803 A1 | 09/1996 | EP |
| EP 0 782 275 A2 | 07/1997 | EP |
| EP 0 785 635 A1 | 07/1997 | EP |
| EP 0 795 955 A2&A3 | 09/1997 | EP |
| EP 0 795 978 A2 | 09/1997 | EP |
| EP 0 817 369 A2&A3 | 01/1998 | EP |

UNITED STATES PATENT AND TRADEMARK OFFICE
CERTIFICATE OF CORRECTION

PATENT NO.         : 7,209,725 B1
APPLICATION NO. : 09/476092
DATED                  : April 24, 2007
INVENTOR(S)        : Sorrells et al.

It is certified that error appears in the above-identified patent and that said Letters Patent is hereby corrected as shown below:

Title Page, Item [56], FOREIGN PATENT DOCUMENTS Section (cont'd)
Please add the following references:

| | | |
|---|---|---|
| EP 0 837 565 A1 | 04/1998 | EP |
| EP 0 862 274 A1 | 09/1998 | EP |
| EP 0 874 499 A2 | 10/1998 | EP |
| EP 0 877 476 A1 | 11/1998 | EP |
| EP 0 977 351 A1 | 02/2000 | EP |
| FR 2 245 130 | 04/1975 | FR |
| FR 2 743 231 A1 | 07/1997 | FR |
| GB 2 161 344 A | 01/1986 | GB |
| GB 2 215 945 A | 09/1989 | GB |
| JP 56-114451 | 09/1981 | JP |
| JP 59-144249 | 08/1984 | JP |
| JP 61-232706 | 10/1986 | JP |
| JP 62-12381 | 01/1987 | JP |
| JP 63-54002 | 03/1988 | JP |
| JP 2-131629 | 05/1990 | JP |
| JP 2-276351 | 11/1990 | JP |
| JP 2-39632 | 02/1990 | JP |
| JP 4-154227 | 05/1992 | JP |
| JP 6-237276 | 08/1994 | JP |
| JP 6-284038 | 10/1994 | JP |
| JP 8-139524 | 05/1996 | JP |
| JP 8-23359 | 01/1996 | JP |
| JP 8-32556 | 02/1996 | JP |
| JP 9-171399 | 06/1997 | JP |
| JP 9-36664 | 02/1997 | JP |
| JP 10-173563 | 06/1998 | JP |
| JP 10-41860 | 02/1998 | JP |
| JP 10-96778 | 04/1998 | JP |
| JP 11-98205 | 04/1999 | JP |
| WO 80/01633 A1 | 08/1980 | PCT |
| WO 91/18445 A1 | 11/1991 | PCT |
| WO 94/05087 A1 | 03/1994 | PCT |
| WO 96/02977 A1 | 02/1996 | PCT |
| WO 96/08078 A1 | 03/1996 | PCT |
| WO 96/39750 A1 | 12/1996 | PCT |
| WO 97/38490 A1 | 10/1997 | PCT |
| WO 98/00953 A1 | 01/1998 | PCT |
| WO 98/24201 A1 | 06/1998 | PCT |

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

Title Page, Item [56], FOREIGN PATENT DOCUMENTS Section (cont'd)
Please add the following references:
WO 98/40968 A2&A3    09/1998    PCT
WO 98/53556 A2        11/1998    PCT
WO 99/23755 A1        05/1999    PCT
WO 00/31659 A1        06/2000    PCT Title Page, Item [56], OTHER PUBLICATIONS Section
Please add the following references:
English-language Abstract of Japanese Patent Publication No. JP 61-232706, data supplied by the espacenet,1 page (October 17, 1986 - Date of publication of application).
English-language Abstract of Japanese Patent Publication No. JP 9-171399, data supplied by the espacenet, 1 page (June 30, 1997 - Date of publication of application).
English-language Abstract of Japanese Patent Publication No. JP 10-41860, data supplied by the espacenet, 1 page (February 13,1998 - Date of publication of application).
English-language Computer Translation of Japanese Patent Publication No.
JP 10-173563, provided by the JPO, 10 pages (June 26, 1998 - Date of publication of application) and cited in U.S. Patent Application Ser. No. 10/305,299, directed to related subject matter.
What is I/Q Data?, printed September 16, 2006, from http://zone.ni.com, 8 pages (Copyright 2003).
Gaudiosi, J., "Retailers will bundle Microsoft's Xbox with games and peripherals," *Video Store Magazine*, Volume 23, Issue 36, pg. 8, 2 pages (September 2-8, 2001).
English-language Translation of German Patent Publication No. DT 1936252, translation provided by Transperfect Translations, 12 pages (January 28, 1971 - Date of publication of application).
English-language Abstract of Japanese Patent Publication No. JP 62-12381, data supplied by the espacenet, 1 page (January 21, 1987 - Date of publication of application).
English-language Abstract of Japanese Patent Publication No. JP 4-154227, data supplied by the espacenet, 1 page (May 27, 1992 - Date of publication of application).
English-language Abstract of Japanese Patent Publication No. JP 6-284038, data supplied by the espacenet,1 page (October 7, 1994 - Date of publication of application).
English-language Abstract of Japanese Patent Publication No. JP 10-96778, data supplied by the espacenet, 1 page (April 14, 1998 - Date of publication of application).
English-language Abstract of Japanese Patent Publication No. JP 11-98205, data supplied by the espacenet, 1 page (April 9,1999 - Date of publication of application).

UNITED STATES PATENT AND TRADEMARK OFFICE
CERTIFICATE OF CORRECTION

PATENT NO.         : 7,209,725 B1
APPLICATION NO. : 09/476092
DATED                : April 24, 2007
INVENTOR(S)      : Sorrells et al.

It is certified that error appears in the above-identified patent and that said Letters Patent is hereby corrected as shown below:

Title Page, Item [56], OTHER PUBLICATIONS Section (cont'd)
Please add the following references:
Hellwarth, G.A. and Jones, G.D, "Automatic Conditioning of Speech Signals," *IEEE Transactions on Audio and Electroacoustics*, Vol. AU-16, No. 2, pp. 169-179 (June 1968).
English Abstract for German Patent No. DE 692 21 098 T2, 1 page, data supplied from the espacenet.
English-language abstract for Japanese Patent Application Publication Number.
JP 09-036664, from http://wwwl9.ipdl.jpo.go.jp, 2 pages (Date of publication of application - February 7, 1997).
Tayloe, D., "A Low-noise, High-performance Zero IF Quadrature Detector/ Preamplifer," RF Design, Primedia Business Magazines & Media, Inc., pp. 58, 60, 62 and 69 (March 2003).
Dines, J.A.B., "Smart Pixel Optoelectronic Receiver Based on a Charge Sensitive Amplifier Design," IEEE Journal of Selected Topics in Quantum Electronics, IEEE, Vol. 2, No. 1, pp. 117-120 (April 1996).
Simon, A. et al., "A Digital Camera for Machine Vision," 20th International Conference on Industrial Electronics, Control and Instrumentation, IEEE, pp. 879-883 (September 1994).
Stewart, R.W. and Pfann, E., "Oversampling and sigma-delta strategies for data conversion," Electronics & Communication Engineering Journal, IEEE, pp. 37-47 (February 1998)
Rudell, J.C. et al., "A 1.9-Ghz Wide-Band IF Double Conversion CMOS Receiver for Cordless Telephone Applications," IEEE Journal of Solid-State Circuits, IEEE, Vol. 32, No. 12, pp. 2071-2088 (December 1997).
Aghvami, H. et al., "Land Mobile Satellites Using the Highly Elliptic Orbits- The UK T-SAT Mobile Payload," Fourth International Conference on Satellite Systems for Mobile Communications and Navigation, IEE, pp. 147-153 (October 17-19, 1988).
Akers, N.P. et al., "RF Sampling Gates: a Brief Review," IEE Proceedings, IEE, Vol. 133, Part A, No.1, pp. 45-49 (January 1986).
Al-Ahmad, H.A.M. et al., "Doppler Frequency Correction for a Non-Geostationary Communications Satellite. Techniques for CERS and T-SAT," Electronics Division Colloquium on Low Noise Oscillators and Synthesizers, IEE, pp. 4/1-4/5 (January 23, 1986).
Ali, I. et al., "Doppler Characterization for LEO Satellites," IEEE Transactions on Communications, IEEE, Vol. 46, No. 3, pp. 309-313 (March 1998).
Allan, D.W., "Statistics of Atomic Frequency Standards," Proceedings Of The IEEE Special Issue on Frequency Stability, IEEE, pp. 221-230 (February 1966).
Allstot, D.J. et al., "MOS Switched Capacitor Ladder Filters," IEEE Journal of Solid-State Circuits, IEEE, Vol. SC-13, No. 6, pp. 806-814 (December 1978).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Allstot, D.J. and Black Jr. W.C., "Technological Design Considerations for Monolithic MOS Switched-Capacitor Filtering Systems," Proceedings of the IEEE, IEEE, Vol. 71, No. 8, pp. 967-986 (August 1983).
Alouini, M. et al., "Channel Characterization and Modeling for Ka-Band Very Small Aperture Terminals," Proceedings Of the IEEE, IEEE, Vol. 85, No. 6, pp. 981-997 (June 1997).
Andreyev, G.A. and Ogarev, S.A., "Phase Distortions of Keyed Millimeter-Wave Signals in the Case of Propagation in a Turbulent Atmosphere," Telecommunications and Radio Engineering, Scripta Technica, Vol. 43, No. 12, pp. 87-90 (December 1988).
Antonetti, A. et al., "Optoelectronic Sampling in the Picosecond Range," Optics Communications, North-Holland Publishing Company, Vol. 21, No. 2, pp. 211-214 (May 1977).
Austin, J. et al., "Doppler Correction of the Telecommunication Payload Oscillators in the UK T-SAT," 18th European Microwave Conference, Microwave Exhibitions and Publishers Ltd., pp. 851-857 (September 12 - 15, 1988).
Auston, D.H., "Picosecond optoelectronic switching and gating in silicon," Applied Physics Letters, American Institute of Physics, Vol. 26, No. 3, pp. 101-103 (February 1, 1975).
Baher, H., "Transfer Functions for Switched-Capacitor and Wave Digital Filters," IEEE Transactions on Circuits and Systems, IEEE Circuits and Systems Society, Vol. CAS-33, No. 11, pp. 1138-1142 (November 1986).
Baines, R., "The DSP Bottleneck," IEEE Communications Magazine, IEEE Communications Society, pp. 46-54 (May 1995).
Banjo, O.P. and Vilar, E., "Binary Error Probabilities on Earth-Space Links Subject to Scintillation Fading," Electronics Letters, IEE, Vol. 21, No. 7, pp. 296-297 (March 28, 1985).
Banjo, O.P. and Vilar, E., "The Dependence of Slant Path Amplitude Scintillations on Various Meteorological Parameters," Fifth International Conference on Antennas and Propagation (ICAP 87) Part 2: Propagation, IEE, pp. 277-280 (March 30 - April 2, 1987).
Banjo, O.P. and Vilar, E. "Measurement and Modeling of Amplitude Scintillations on Low-Elevation Earth-Space Paths and Impact on Communication Systems," IEEE Transactions on Communications, IEEE Communications Society, Vol. COM-34, No. 8, pp. 774-780 (August 1986).
Banjo, O.P. et al., "Tropospheric Amplitude Spectra Due to Absorption and Scattering in Earth-Space Paths," Fourth International Conference on Antennas and Propagation (ICAP 85), IEE, pp. 77-82 (April 16-19, 1985).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Basili, P. et al., "Case Study of Intense Scintillation Events on the OTS Path," IEEE Transactions on Antennas and Propagation, IEEE, Vol. 38, No. 1, pp. 107-113 (January 1990).
Basili, P. et al., "Observation of High C2 and Turbulent Path Length on OTS Space-Earth Link," Electronics Letters, IEE, Vol. 24, No. 17, pp. 1114-1116 (August 18, 1988).
Blakey, J.R. et al., "Measurement of Atmospheric Millimetre-Wave Phase Scintillations in an Absorption Region," Electronics Letters, IEE, Vol. 21, No. 11, pp. 486-487 (May 23, 1985).
Burgueño, A. et al., "Influence of rain gauge integration time on the rain rate statistics used in microwave communications," annales des tèlècommunications, International Union of Radio Science, pp. 522-527 (September/October 1988).
Burgueño, A. et al., "Long-Term Joint Statistical Analysis of Duration and Intensity of Rainfall Rate with Application to Microwave Communications," Fifth International Conference on Antennas and Propagation (ICAP 87) Part 2: Propagation, IEE, pp. 198-201 (March 30 - April 2, 1987).
Burgueño, A. et al., "Long Term Statistics of Precipitation Rate Return Periods in the Context of Microwave Communications," Sixth International Conference on Antennas and Propagation (ICAP 89) Part 2: Propagation, IEE, pp. 297-301 (April 4-7, 1989).
Burgueño, A. et al., "Spectral Analysis of 49 Years of Rainfall Rate and Relation to Fade Dynamics," IEEE Transactions on Communications, IEEE Communications Society, Vol. 38, No. 9, pp. 1359-1366 (September 1990).
Catalan, C. and Vilar, E., "Approach for satellite slant path remote sensing," Electronics Letters, IEE, Vol. 34, No. 12, pp. 1238-1240 (June 11, 1998).
Chan, P. et al., "A Highly Linear 1-GHz CMOS Downconversion Mixer," European Solid State Circuits Conference, IEEE Communication Society, pp. 210-213 (September 22-24, 1993).
Copy of Declaration of Michael J. Bultman filed in patent application Ser. No. 09/176,022, which is directed to related subject matter.
Copy of Declaration of Robert W. Cook filed in patent application Ser. No. 09/176,022, which is directed to related subject matter.
Copy of Declaration of Alex Holtz filed in patent application Ser. No. 09/176,022, which is directed to related subject matter.
Copy of Declaration of Richard C. Looke filed in patent application Ser. No. 09/176,022, which is directed to related subject matter.
Copy of Declaration of Charley D. Moses, Jr. filed in patent application Ser. No. 09/176,022, which is directed to related subject matter.

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], OTHER PUBLICATIONS Section</u> (cont'd)
Please add the following references:
Copy of Declaration of Jeffrey L. Parker and David F. Sorrells, with attachment Exhibit 1, filed in patent application Ser. No. 09/176,022, which is directed to related subject matter.
Dewey, R.J. and Collier, C.J., "Multi-Mode Radio Receiver," Electronics Division Colloquium on Digitally Implemented Radios, IEE, pp. 3/1-3/5 (October 18, 1985).
DIALOG File 347 (JAPIO) English Language Patent Abstract for JP 2-276351, published November 13, 1990, (1 Page).
DIALOG File 347 (JAPIO) English Language Patent Abstract for JP 2-131629, published May 21, 1990, (1 Page).
DIALOG File 347 (JAPIO) English Language Patent Abstract for JP 2-39632, published February 8, 1990, (1 Page).
DIALOG File 348 (European Patents) English Language Patent Abstract for EP 0 785 635 A1, published December 26, 1996, (3 Pages).
DIALOG File 348 (European Patents) English Language Patent Abstract for EP 35166 A1, published February 18, 1981, (2 Pages).
DSO takes sampling rate to 1 Ghz, Electronic Engineering, Morgan Grampian Publishers, Vol. 59, No. 723, pp. 77 and 79 (March 1987).
Erdi, G. and Henneuse, P.R., "A Precision FET-Less Sample-and-Hold with High Charge-to-Droop Current Ratio," IEEE Journal of Solid-State Circuits, IEEE, Vol. SC-13, No. 6, pp. 864-873 (December 1978).
Faulkner, N.D. and Vilar, E., "Subharmonic Sampling for the Measurement of Short Term Stability of Microwave Oscillators," IEEE Transactions on Instrumentation and Measurement, IEEE, Vol. IM-32, No. 1, pp. 208-213 (March 1983).
Faulkner, N.D. et al., "Sub-Harmonic Sampling for the Accurate Measurement of Frequency Stability of Microwave Oscillators," CPEM 82 Digest: Conference on Precision Electromagnetic Measurements, IEEE, pp. M-10 and M-11 (1982).
Faulkner, N.D. and Vilar, E., "Time Domain Analysis of Frequency Stability Using Non-Zero Dead-Time Counter Techniques," CPEM 84 Digest Conference on Precision Electromagnetic Measurements, IEEE, pp. 81-82 (1984).
Filip, M. and Vilar, E., "Optimum Utilization of the Channel Capacity of a Satellite Link in the Presence of Amplitude Scintillations and Rain Attenuation," IEEE Transactions on Communications, IEEE Communications Society, Vol. 38, No. 11, pp. 1958-1965 (November 1990).
Fukahori, K., "A CMOS Narrow-Band Signaling Filter with Q Reduction," IEEE Journal of Solid-State Circuits, IEEE, Vol. SC-19, No. 6, pp. 926-932 (December 1984).
Fukuchi, H. and Otsu, Y., "Available time statistics of rain attenuation on earth-space path," IEE Proceedings-H: Microwaves, Antennas and Propagation, IEE, Vol. 135, Pt. H, No. 6, pp. 387-390 (December 1988).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Gibbins, C.J. and Chadha, R., "Millimetre-wave propagation through hydrocarbon flame," IEE Proceedings, IEE, Vol. 134, Pt. H, No.2 , pp. 169-173 (April 1987).
Gilchrist, B. et al., "Sampling hikes performance of frequency synthesizers," Microwaves & RF, Hayden Publishing, Vol. 23, No. 1, pp. 93-94 and 110 (January 1984).
Gossard, E.E., "Clear weather meteorological effects on propagation at frequencies above 1 Ghz," Radio Science, American Geophysical Union, Vol. 16, No. 5, pp. 589-608 (September - October 1981).
Gregorian, R. et al., "Switched-Capacitor Circuit Design," Proceedings of the IEEE, IEEE, Vol. 71, No. 8, pp. 941-966 (August 1983).
Groshong et al., "Undersampling Techniques Simplify Digital Radio," Electronic Design, Penton Publishing, pp. 67-68, 70, 73-75 and 78 (May 23, 1991).
Grove, W.M., "Sampling for Oscilloscopes and Other RF Systems: Dc through X-Band," IEEE Transactions on Microwave Theory and Techniques, IEEE, pp. 629-635 (December 1966).
Haddon, J. et al., "Measurement of Microwave Scintillations on a Satellite Down-Link at X-Band," Antennas and Propagation, IEE, pp. 113-117 (1981).
Haddon, J. and Vilar, E., "Scattering Induced Microwave Scintillations from Clear Air and Rain on Earth Space Paths and the Influence of Antenna Aperture," IEEE Transactions on Antennas and Propagation, IEEE, Vol. AP-34, No. 5, pp. 646-657 (May 1986).
Hafdallah, H. et al., "2-4 Ghz MESFET Sampler," Electronics Letters, IEE, Vol. 24, No. 3, pp. 151-153 (February 4, 1988).
Herben, M.H.A.J., "Amplitude and Phase Scintillation Measurements on 8-2 km Line-Of-Sight Path at 30 Ghz," Electronics Letters, IEE, Vol. 18, No. 7, pp. 287-289 (April 1, 1982).
Hewitt, A. et al., "An 18 Ghz Wideband LOS Multipath Experiment," International Conference on Measurements for Telecommunication Transmission Systems - MTTS 85, IEE, pp. 112-116 (November 27-28, 1985)
Hewitt, A. et al., "An Autoregressive Approach to the Identification of Multipath Ray Parameters from Field Measurements," IEEE Transactions on Communications, IEEE Communications Society, Vol. 37, No. 11, pp. 1136-1143 (November 1989).
Hewitt, A. and Vilar, E., "Selective fading on LOS Microwave Links: Classical and Spread-Spectrum Measurement Techniques," IEEE Transactions on Communications, IEEE Communications Society, Vol. 36, No. 7, pp. 789-796 (July 1988).
Hospitalier, E., "Instruments for Recording and Observing Rapidly Varying Phenomena," Science Abstracts, IEE, Vol. VII, pp. 22-23 (1904).

UNITED STATES PATENT AND TRADEMARK OFFICE
CERTIFICATE OF CORRECTION

PATENT NO.       : 7,209,725 B1
APPLICATION NO.  : 09/476092
DATED            : April 24, 2007
INVENTOR(S)      : Sorrells et al.

It is certified that error appears in the above-identified patent and that said Letters Patent is hereby corrected as shown below:

Title Page, Item [56], OTHER PUBLICATIONS Section (cont'd)
Please add the following references:
Howard, I.M. and Swansson, N.S., "Demodulating High Frequency Resonance Signals for Bearing Fault Detection," The Institution of Engineers Australia Vibration and Noise Conference, Institution of Engineers, Australia, pp. 115-121
(September 18-20, 1990).
Hu, X., A Switched-Current Sample-and-Hold Amplifier for FM Demodulation, Thesis for Master of Applied Science, Dept. of Electrical and Computer Engineering, University of Toronto, UMI Dissertation Services, pp. 1-64 (1995).
Hung, H-L. A. et al., "Characterization of Microwave Integrated Circuits Using An Optical Phase-Locking and Sampling System," IEEE MTT-S Digest, IEEE, pp. 507-510 (1991).
Hurst, P.J., "Shifting the Frequency Response of Switched-Capacitor Filters by Nonuniform Sampling," IEEE Transactions on Circuits and Systems, IEEE Circuits and Systems Society, Vol. 38, No. 1, pp. 12-19 (January 1991).
Itakura, T., "Effects of the sampling pulse width on the frequency characteristics of a sample-and-hold circuit," IEE Proceedings Circuits, Devices and Systems, IEE, Vol. 141, No. 4, pp. 328-336 (August 1994).
Janssen, J.M.L., "An Experimental 'Stroboscopic' Oscilloscope for Frequencies up to about 50 Mc/s: I. Fundamentals," Philips Technical Review, Philips Research Laboratories, Vol. 12, No. 2, pp. 52-59 (August 1950).
Janssen, J.M.L. and Michels, A.J., "An Experimental 'Stroboscopic' Oscilloscope for Frequencies up to about 50 Mc/s: II. Electrical Build-Up," Philips Technical Review, Philips Research Laboratories, Vol. 12, No. 3, pp. 73-82 (September 1950).
Jondral, V.F. et al., "Doppler Profiles for Communication Satellites," Frequenz, Herausberger, pp. 111-116 (May-June 1996).
Kaleh, G.K., "A Frequency Diversity Spread Spectrum System for Communication in the Presence of In-band Interference," 1995 IEEE Globecom, IEEE Communications Society, pp. 66-70 (1995).
Karasawa, Y. et al., "A New Prediction Method for Tropospheric Scintillation on Earth-Space Paths," IEEE Transactions on Antennas and Propagation, IEEE Antennas and Propagation Society, Vol. 36, No. 11, pp. 1608-1614 (November 1988).
Kirsten, J. and Fleming, J., "Undersampling reduces data-acquisition costs for select applications," EDN, Cahners Publishing, Vol. 35, No. 13, pp. 217-222, 224, 226-228 (June 21, 1990).
Lam, W.K. et al., "Measurement of the Phase Noise Characteristics of an Unlocked Communications Channel Identifier," Proceedings Of the 1993 IEEE International Frequency Control Symposium, IEEE, pp. 283-288 (June 2-4, 1993).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Lam, W.K. et al., "Wideband sounding of 11.6 Ghz transhorizon channel," Electronics Letters, IEE, Vol. 30, No. 9, pp. 738-739 (April 28, 1994).
Larkin, K.G., "Efficient demodulator for bandpass sampled AM signals," Electronics Letters, IEE, Vol. 32, No. 2, pp. 101-102 (January 18, 1996).
Lau, W.H. et al., "Analysis of the Time Variant Structure of Microwave Line-of-sight Multipath Phenomena," IEEE Global Telecommunications Conference & Exhibition, IEEE, pp. 1707-1711 (November 28 - December 1, 1988).
Lau, W.H. et al., "Improved Prony Algorithm to Identify Multipath Components," Electronics Letters, IEE, Vol. 23, No. 20, pp. 1059-1060 (September 24, 1987).
Lesage, P. and Audoin, C., "Effect of Dead-Time on the Estimation of the Two-Sample Variance," IEEE Transactions on Instrumentation and Measurement, IEEE Instrumentation and Measurement Society, Vol. IM-28, No. 1, pp. 6-10 (March 1979).
Liechti, C.A., "Performance of Dual-gate GaAs MESFET's as Gain-Controlled Low-Noise Amplifiers and High-Speed Modulators," IEEE Transactions on Microwave Theory and Techniques, IEEE Microwave Theory and Techniques Society, Vol. MTT-23, No. 6, pp. 461-469 (June 1975).
Linnenbrink, T.E. et al., "A One Gigasample Per Second Transient Recorder," IEEE Transactions on Nuclear Science, IEEE Nuclear and Plasma Sciences Society, Vol. NS-26, No. 4, pp. 4443-4449 (August 1979).
Liou, M.L., "A Tutorial on Computer-Aided Analysis of Switched-Capacitor Circuits," Proceedings of the IEEE, IEEE, Vol. 71, No. 8, pp. 987-1005 (August 1983).
Lo, P. et al., "Coherent Automatic Gain Control," IEE Colloquium on Phase Locked Techniques, IEE, pp. 2/1-2/6 (March 26, 1980).
Lo, P. et al., "Computation of Rain Induced Scintillations on Satellite Down-Links at Microwave Frequencies," Third International Conference on Antennas and Propagation (ICAP 83), pp. 127-131 (April 12-15, 1983).
Lo, P.S.L.O. et al., "Observations of Amplitude Scintillations on a Low-Elevation Earth-Space Path," Electronics Letters, IEE, Vol. 20, No. 7, pp. 307-308 (March 29, 1984).
Madani, K. and Aithison, C.S., "A 20 Ghz Microwave Sampler," IEEE Transactions on Microwave Theory and Techniques, IEEE Microwave Theory and Techniques Society, Vol. 40, No. 10, pp. 1960-1963 (October 1992).
Marsland, R.A. et al., "130 Ghz GaAs monolithic integrated circuit sampling head," Appl. Phys. Lett., American Institute of Physics, Vol. 55, No. 6, pp. 592-594 (August 7, 1989).
Martin, K. and Sedra, A.S., "Switched-Capacitor Building Blocks for Adaptive Systems," IEEE Transactions on Circuits and Systems, IEEE Circuits and Systems Society, Vol. CAS-28, No. 6, pp. 576-584 (June 1981).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Marzano, F.S. and d'Auria, G., "Model-based Prediction of Amplitude Scintillation variance due to Clear-Air Tropospheric Turbulence on Earth-Satellite Microwave Links," IEEE Transactions on Antennas and Propagation, IEEE Antennas and Propagation Society, Vol. 46, No. 10, pp. 1506-1518 (October 1998).
Matricciani, E., "Prediction of fade durations due to rain in satellite communication systems," Radio Science, American Geophysical Union, Vol. 32, No. 3, pp. 935-941 (May-June 1997).
McQueen, J.G., "The Monitoring of High-Speed Waveforms," Electronic Engineering, Morgan Brothers Limited, Vol. XXIV, No. 296, pp. 436-441 (October 1952).
Merkelo, J. and Hall, R.D., "Broad-Band Thin-Film Signal Sampler," IEEE Journal of Solid-State Circuits, IEEE, Vol. SC-7, No. 1, pp. 50-54 (February 1972).
Merlo, U. et al., "Amplitude Scintillation Cycles in a Sirio Satellite-Earth Link," Electronics Letters, IEE, Vol. 21, No. 23, pp. 1094-1096 (November 7, 1985).
Morris, D., "Radio-holographic reflector measurement of the 30-m millimeter radio telescope at 22 Ghz with a cosmic signal source," Astronomy and Astrophysics, Springer-Verlag, Vol. 203, No. 2, pp. 399-406 (September (II) 1988).
Moulsley, T.J. et al., "The efficient acquisition and processing of propagation statistics," Journal of the Institution of Electronic and Radio Engineers, IERE, Vol. 55, No. 3, pp. 97-103 (March 1985).
Ndzi, D. et al., "Wide-Band Statistical Characterization of an Over-the-Sea Experimental Transhorizon Link," IEE Colloquium on Radio Communications at Microwave and Millimetre Wave Frequencies, IEE, pp. 1/1-1/6 (December 16, 1996).
Ndzi, D. et al., "Wideband Statistics of Signal Levels and Doppler Spread on an Over-The-Sea Transhorizon Link," IEE Colloquium on Propagation Characteristics and Related System Techniques for Beyond Line-of-Sight Radio, IEE, pp. 9/1-9/6 (November 24, 1997).
New zero IF chipset from Philips, Electronic Engineering, United News & Media, Vol. 67, No. 825, p.10 (September 1995).
Ohara, H. et al., "First monolithic PCM filter cuts cost of telecomm systems," Electronic Design, Hayden Publishing Company, Vol. 27, No. 8, pp. 130-135 (April 12, 1979).
Oppenheim, A.V. et al., Signals and Systems, Prentice-Hall, pp. 527-531 and 561-562 (1983).
Ortgies, G., "Experimental Parameters Affecting Amplitude Scintillation Measurements on Satellite Links," Electronics Letters, IEE, Vol. 21, No. 17, pp. 771-772 (August 15, 1985).

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

Title Page, Item [56], OTHER PUBLICATIONS Section (cont'd)
Please add the following references:
Pärssinen et al., "A 2-GHz Subharmonic Sampler for Signal Downconversion," IEEE Transactions on Microwave Theory and Techniques, IEEE, Vol. 45, No. 12, 7 pages (December 1997).
Peeters, G. et al., "Evaluation of Statistical Models for Clear-Air Scintillation Prediction Using Olympus Satellite Measurements," International Journal of Satellite Communications, John Wiley and Sons, Vol. 15, No. 2, pp. 73-88 (March-April 1997).
Perrey, A.G. and Schoenwetter, H.K., NBS Technical Note 1121: A Schottky Diode Bridge Sampling Gate, U.S. Dept. of Commerce, pp. 1-14 (May 1980).
Poulton, K. et al., "A 1-Ghz 6-bit ADC System," IEEE Journal of Solid-State Circuits, IEEE, Vol. SC-22, No. 6, pp. 962-969 (December 1987).
Press Release, "Parkervision, Inc. Announces Fiscal 1993 Results," Lippert/Heilshorn and Associates, 2 Pages (April 6, 1994).
Press Release, "Parkervision, Inc. Announces the Appointment of Michael Baker to the New Position of National Sales Manager," Lippert/Heilshorn and Associates, 1 Page (April 7, 1994).
Press Release, "Parkervision's Cameraman Well-Received By Distance Learning Market," Lippert/Heilshorn and Associates, 2 Pages (April 8, 1994).
Press Release, "Parkervision, Inc. Announces First Quarter Financial Results," Lippert/Heilshorn and Associates, 2 Pages (April 26, 1994).
Press Release, "Parkervision, Inc. Announces The Retirement of William H. Fletcher, Chief Financial Officer," Lippert/Heilshorn and Associates, 1 Page (May 11, 1994).
Press Release, "Parkervision, Inc. Announces New Cameraman System II™ At Infocomm Trade Show," Lippert/Heilshorn and Associates, 3 Pages (June 9, 1994).
Press Release, "Parkervision, Inc. Announces Appointments to its National Sales Force," Lippert/Heilshorn and Associates, 2 Pages (June 17, 1994).
Press Release, "Parkervision, Inc. Announces Second Quarter and Six Months Financial Results," Lippert/Heilshorn and Associates, 3 Pages (August 9, 1994).
Press Release, "Parkervision, Inc. Announces Third Quarter and Nine Months Financial Results," Lippert/Heilshorn and Associates, 3 Pages (October 28, 1994).
Press Release, "Parkervision, Inc. Announces First Significant Dealer Sale of Its Cameraman® System II," Lippert/Heilshorn and Associates, 2 Pages (November 7, 1994).
Press Release, "Parkervision, Inc. Announces Fourth Quarter and Year End Results," Lippert/Heilshorn and Associates, 2 Pages (March 1, 1995).
Press Release, "Parkervision, Inc. Announces Joint Product Developments With VTEL," Lippert/Heilshorn and Associates, 2 Pages (March 21, 1995).
Press Release, "Parkervision, Inc. Announces First Quarter Financial Results," Lippert/Heilshorn and Associates, 3 Pages (April 28, 1995).

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], OTHER PUBLICATIONS Section</u> (cont'd)
Please add the following references:
Press Release, "Parkervision Wins Top 100 Product Districts' Choice Award," Parkervision Marketing and Manufacturing Headquarters, 1 Page (June 29, 1995).
Press Release, "Parkervision National Sales Manager Next President of USDLA," Parkervision Marketing and Manufacturing Headquarters, 1 Page (July 6, 1995).
Press Release, "Parkervision Granted New Patent," Parkervision Marketing and Manufacturing Headquarters, 1 Page (July 21, 1995).
Press Release, "Parkervision, Inc. Announces Second Quarter and Six Months Financial Results," Parkervision Marketing and Manufacturing Headquarters, 2 Pages
(July 31, 1995).
Press Release, "Parkervision, Inc. Expands Its Cameraman System II Product Line," Parkervision Marketing and Manufacturing Headquarters, 2 Pages
(September 22, 1995).
Press Release, "Parkervision Announces New Camera Control Technology," Parkervision Marketing and Manufacturing Headquarters, 2 Pages (October 25, 1995).
Press Release, "Parkervision, Inc. Announces Completion of VTEL/Parkervision Joint Product Line," Parkervision Marketing and Manufacturing Headquarters, 2 Pages
(October 30, 1995).
Press Release, "Parkervision, Inc. Announces Third Quarter and Nine Months Financial Results," Parkervision Marketing and Manufacturing Headquarters, 2 Pages
(October 30, 1995).
Press Release, "Parkervision's Cameraman Personal Locator Camera System Wins Telecon XV Award," Parkervision Marketing and Manufacturing Headquarters, 2 Pages
(November 1, 1995).
Press Release, "Parkervision, Inc. Announces Purchase Commitment From VTEL Corporation," Parkervision Marketing and Manufacturing Headquarters, 1 Page
(February 26,1996).
Press Release, "ParkerVision, Inc. Announces Fourth Quarter and Year End Results," Parkervision Marketing and Manufacturing Headquarters, 2 Pages (February 27,1996).
Press Release, "ParkerVision, Inc. Expands its Product Line," Parkervision Marketing and Manufacturing Headquarters, 2 Pages (March 7, 1996).
Press Release, "ParkerVision Files Patents for its Research of Wireless Technology," Parkervision Marketing and Manufacturing Headquarters, 1 Page (March 28, 1996).
Press Release, "Parkervision, Inc. Announces First Significant Sale of Its Cameraman® Three-Chip System," Parkervision Marketing and Manufacturing Headquarters, 2 pages
(April 12, 1996).
Press Release, "Parkervision, Inc. Introduces New Product Line For Studio Production Market," Parkervision Marketing and Manufacturing Headquarters, 2 Pages
(April 15, 1996).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Press Release, "Parkervision, Inc. Announces Private Placement of 800,000 Shares," Parkervision Marketing and Manufacturing Headquarters, 1 Page (April 15, 1996).
Press Release, "Parkervision, Inc. Announces First Quarter Financial Results," Parkervision Marketing and Manufacturing Headquarters, 3 Pages (April 30, 1996).
Press Release, "ParkerVision's New Studio Product Wins Award," Parkervision Marketing and Manufacturing Headquarters, 2 Pages (June 5, 1996).
Press Release, "Parkervision, Inc. Announces Second Quarter and Six Months Financial Results," Parkervision Marketing and Manufacturing Headquarters, 3 Pages (August 1, 1996).
Press Release, "Parkervision, Inc. Announces Third Quarter and Nine Months Financial Results," Parkervision Marketing and Manufacturing Headquarters, 2 Pages (October 29, 1996).
Press Release, "PictureTel and ParkerVision Sign Reseller Agreement," Parkervision Marketing and Manufacturing Headquarters, 2 Pages (October 30, 1996).
Press Release, "CLI and ParkerVision Bring Enhanced Ease-of-Use to Videoconferencing," CLI/Parkervision, 2 Pages (January 20, 1997).
Press Release, "Parkervision, Inc. Announces Fourth Quarter and Year End Results," Parkervision Marketing and Manufacturing Headquarters, 3 Pages (February 27, 1997).
Press Release, "Parkervision, Inc. Announces First Quarter Financial Results," Parkervision Marketing and Manufacturing Headquarters, 3 Pages (April 29, 1997).
Press Release, "NEC and Parkervision Make Distance Learning Closer," NEC America, 2 Pages (June 18, 1997).
Press Release, "Parkervision Supplies JPL with Robotic Cameras, Cameraman Shot Director for Mars Mission," Parkervision Marketing and Manufacturing Headquarters, 2 pages (July 8,1997).
Press Release, "ParkerVision and IBM Join Forces to Create Wireless Computer Peripherals," Parkervision Marketing and Manufacturing Headquarters, 2 Pages (July 23, 1997).
Press Release, "ParkerVision, Inc. Announces Second Quarter and Six Months Financial Results," Parkervision Marketing and Manufacturing Headquarters, 3 Pages (July 31, 1997).
Press Release, "Parkervision, Inc. Announces Private Placement of 990,000 Shares," Parkervision Marketing and Manufacturing Headquarters, 2 Pages (September 8, 1997).
Press Release, "Wal-Mart Chooses Parkervision for Broadcast Production," Parkervision Marketing and Manufacturing Headquarters, 2 Pages (October 24, 1997).
Press Release, "Parkervision, Inc. Announces Third Quarter Financial Results," Parkervision Marketing and Manufacturing Headquarters, 3 Pages (October 30, 1997).

UNITED STATES PATENT AND TRADEMARK OFFICE
CERTIFICATE OF CORRECTION

| | |
|---|---|
| PATENT NO. | : 7,209,725 B1 |
| APPLICATION NO. | : 09/476092 |
| DATED | : April 24, 2007 |
| INVENTOR(S) | : Sorrells et al. |

It is certified that error appears in the above-identified patent and that said Letters Patent is hereby corrected as shown below:

<u>Title Page, Item [56], OTHER PUBLICATIONS Section</u> (cont'd)
Please add the following references:
Press Release, "ParkerVision Announces Breakthrough in Wireless Radio Frequency Technology," Parkervision Marketing and Manufacturing Headquarters, 3 Pages (December 10, 1997).
Press Release, "Parkervision, Inc. Announces the Appointment of Joseph F. Skovron to the Position of Vice President, Licensing - Wireless Technologies," Parkervision Marketing and Manufacturing Headquarters, 2 Pages (January 9, 1998).
Press Release, "Parkervision Announces Existing Agreement with IBM Terminates-- Company Continues with Strategic Focus Announced in December," Parkervision Marketing and Manufacturing Headquarters, 2 Pages (January 27, 1998).
Press Release, "Laboratory Tests Verify Parkervision Wireless Technology," Parkervision Marketing and Manufacturing Headquarters, 2 Pages (March 3, 1998).
Press Release, "Parkervision, Inc. Announces Fourth Quarter and Year End Financial Results," Parkervision Marketing and Manufacturing Headquarters, 3 Pages (March 5, 1998).
Press Release, "Parkervision Awarded Editors' Pick of Show for NAB 98," Parkervision Marketing and Manufacturing Headquarters, 2 Pages (April 15, 1998).
Press Release, "Parkervision Announces First Quarter Financial Results," Parkervision Marketing and Manufacturing Headquarters, 3 Pages (May 4, 1998).
Press Release, "Parkervision 'DIRECT2DATA' Introduced in Response to Market Demand," Parkervision Marketing and Manufacturing Headquarters, 3 Pages (July 9, 1998).
Press Release, "Parkervision Expands Senior Management Team," Parkervision Marketing and Manufacturing Headquarters, 2 Pages (July 29, 1998).
Press Release, "Parkervision Announces Second Quarter and Six Month Financial Results," Parkervision Marketing and Manufacturing Headquarters, 4 Pages (July 30, 1998).
Press Release, "Parkervision Announces Third Quarter and Nine Month Financial Results," Parkervision Marketing and Manufacturing Headquarters, 3 Pages (October 30, 1998).
Press Release, "Questar Infocomm, Inc. Invests $5 Million in Parkervision Common Stock," Parkervision Marketing and Manufacturing Headquarters, 3 Pages (December 2, 1998).
Press Release, "Parkervision Adds Two New Directors," Parkervision Marketing and Manufacturing Headquarters, 2 Pages (March 5, 1999).
Press Release, "Parkervision Announces Fourth Quarter and Year End Financial Results," Parkervision Marketing and Manufacturing Headquarters, 3 Pages (March 5, 1999).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Press Release, "Joint Marketing Agreement Offers New Automated Production Solution," Parkervision Marketing and Manufacturing Headquarters, 2 Pages (April 13,1999).
Project COST 205: Scintillations in Earth-satellite links, Alta Frequenza: Scientific Review in Electronics, AEI, Vol. LIV, No. 3, pp. 209-211 (May-June, 1985).
Razavi, B., RF Microelectronics, Prentice-Hall, pp. 147-149 (1998).
Reeves, R.J.D., "The Recording and Collocation of Waveforms (Part 1)," Electronic Engineering, Morgan Brothers Limited, Vol. 31, No. 373, pp. 130-137 (March 1959).
Reeves, R.J.D., "The Recording and Collocation of Waveforms (Part 2)," Electronic Engineering, Morgan Brothers Limited, Vol. 31, No. 374, pp. 204-212 (April 1959).
Rein, H.M. and Zahn, M., "Subnanosecond-Pulse Generator with Variable Pulsewidth Using Avalanche Transistors," Electronics Letters, IEE, Vol. 11, No. 1, pp. 21-23 (January 9, 1975).
Riad, S.M. and Nahman, N.S., "Modeling of the Feed-through Wideband (DC to 12.4 Ghz) Sampling-Head," IEEE MTT-S International Microwave Symposium Digest, IEEE, pp. 267-269 (June 27-29, 1978).
Rizzoli, V. et al., "Computer-Aided Noise Analysis of MESFET and HEMT Mixers," IEEE Transactions on Microwave Theory and Techniques, IEEE, Vol. 37, No. 9, pp. 1401-1410 (September 1989).
Rowe, H.E., Signals and Noise in Communication Systems, D. Van Nostrand Company, Inc., Princeton, New Jersey, including, for example, Chapter V, Pulse Modulation Systems (1965).
Rücker, F. and Dintelmann, F., "Effect of Antenna Size on OTS Signal Scintillations and Their Seasonal Dependence," Electronics Letters, IEE, Vol. 19, No. 24, pp. 1032-1034 (November 24, 1983).
Russell, R. and Hoare, L., "Millimeter Wave Phase Locked Oscillators," Military Microwaves '78 Conference Proceedings, Microwave Exhibitions and Publishers, pp. 238-242 (October 25-27, 1978).
Sabel, L.P., "A DSP Implementation of a Robust Flexible Receiver/Demultiplexer for Broadcast Data Satellite Communications," The Institution of Engineers Australia Communications Conference, Institution of Engineers, Australia, pp. 218-223 (October 16-18, 1990).
Salous, S., "IF digital generation of FMCW waveforms for wideband channel characterization," IEE Proceedings-I, IEE, Vol. 139, No. 3, pp. 281-288 (June 1992).
Sampling Loops Lock Sources to 23 Ghz, Microwaves & RF, Penton Publishing, p. 212 (September 1990).
Sasikumar, M. et al., "Active Compensation in the Switched-Capacitor Biquad," Proceedings of the IEEE, IEEE, Vol. 71, No. 8, pp. 1008-1009 (August 1983).

UNITED STATES PATENT AND TRADEMARK OFFICE
CERTIFICATE OF CORRECTION

PATENT NO.       : 7,209,725 B1
APPLICATION NO.  : 09/476092
DATED            : April 24, 2007
INVENTOR(S)      : Sorrells et al.

It is certified that error appears in the above-identified patent and that said Letters Patent is hereby corrected as shown below:

Title Page, Item [56], OTHER PUBLICATIONS Section (cont'd)
Please add the following references:
Saul, P.H., "A GaAs MESFET Sample and Hold Switch," Fifth European Solid State Circuits Conference- ESSCIRC 79, IEE, pp. 5-7 (1979).
Shen, D.H. et al., "A 900-MHZ RF Front-End with Integrated Discrete-Time Filtering," IEEE Journal of Solid-State Circuits, IEEE Solid-State Circuits Council, Vol. 31, No. 12, pp. 1945-1954 (December 1996).
Shen, X.D. and Vilar, E., "Anomalous transhorizon propagation and meteorological processes of a multilink path," Radio Science, American Geophysical Union, Vol. 30, No. 5, pp. 1467-1479 (September-October 1995).
Shen, X. and Tawfik, A.N., "Dynamic Behaviour of Radio Channels Due to Trans-Horizon Propagation Mechanisms," Electronics Letters, IEE, Vol. 29, No. 17, pp. 1582-1583 (August 19, 1993).
Shen, X. et al., "Modeling Enhanced Spherical Diffraction and Troposcattering on a Transhorizon Path with aid of the parabolic Equation and Ray Tracing Methods," IEE Colloquium on Common modeling techniques for electromagnetic wave and acoustic wave propagation, IEE, pp. 4/1-4/7 (March 8, 1996).
Shen, X. and Vilar, E., "Path loss statistics and mechanisms of transhorizon propagation over a sea path," Electronics Letters, IEE, Vol. 32, No. 3, pp. 259-261 (February 1, 1996).
Shen, D. et al., "A 900 MHZ Integrated Discrete-Time Filtering RF Front-End," IEEE International Solid State Circuits Conference, IEEE, Vol. 39, pp. 54-55 and 417 (February 1996).
Spillard, C. et al., "X-Band Tropospheric Transhorizon Propagation Under Differing Meteorological Conditions," Sixth International Conference on Antennas and Propagation (ICAP 89) Part 2: Propagation, IEE, pp. 451-455 (April 4-7, 1989).
Stafford, K.R. et al., "A Complete Monolithic Sample/Hold Amplifier," IEEE Journal of Solid-State Circuits, IEEE, Vol. SC-9, No. 6, pp. 381-387 (December 1974).
Staruk, W. Jr. et al., "Pushing HF Data Rates," Defense Electronics, EW Communications, Vol. 17, No. 5, pp. 211, 213, 215, 217, 220 and 222 (May 1985).
Stephenson, A.G., "Digitizing multiple RF signals requires an optimum sampling rate," Electronics, McGraw-Hill, pp. 106-110 (March 27, 1972).
Sugarman, R., "Sampling Oscilloscope for Statistically Varying Pulses," The Review of Scientific Instruments, American Institute of Physics, Vol. 28, No. 11, pp. 933-938 (November 1957).
Sylvain, M., "Experimental probing of multipath microwave channels," Radio Science, American Geophysical Union, Vol. 24, No. 2, pp. 160-178 (March-April 1989).
Takano, T., "NOVEL GaAs Pet Phase Detector Operable To Ka Band," IEEE MT-S Digest, IEEE, pp. 381-383 (1984).

UNITED STATES PATENT AND TRADEMARK OFFICE
CERTIFICATE OF CORRECTION

PATENT NO.       : 7,209,725 B1
APPLICATION NO.  : 09/476092
DATED            : April 24, 2007
INVENTOR(S)      : Sorrells et al.

It is certified that error appears in the above-identified patent and that said Letters Patent is hereby corrected as shown below:

Title Page, Item [56], OTHER PUBLICATIONS Section (cont'd)
Please add the following references:
Tan, M.A., "Biquadratic Transconductance Switched-Capacitor Filters," IEEE Transactions on Circuits and Systems-I: Fundamental Theory and Applications, IEEE Circuits and Systems Society, Vol. 40, No. 4, pp. 272-275 (April 1993).
Tanaka, K. et al., "Single Chip Multisystem AM Stereo Decoder IC," IEEE Transactions on Consumer Electronics, IEEE Consumer Electronics Society, Vol. CE-32, No. 3, pp. 482-496 (August 1986).
Tawfik, A.N., "Amplitude, Duration and Predictability of Long Hop Trans-Horizon X-band Signals Over the Sea," Electronics Letters, IEE, Vol. 28, No. 6, pp. 571-572 (March 12, 1992).
Tawfik, A.N. and Vilar, E., "Correlation of Transhorizon Signal Level Strength with Localized Surface Meteorological Parameters," Eighth International Conference on Antennas and Propagation, Electronics Division of the IEE, pp. 335-339 (March 30- April 2, 1993).
Tawfik, A.N. and Vilar, E., "Dynamic Structure of a Transhorizon Signal at X-band Over a Sea Path," Sixth International Conference on Antennas and Propagation (ICAP 89) Part 2: Propagation, IEE, pp. 446-450 (April 4-7, 1989).
Tawfik, A.N. and Vilar, E., "Statistics of Duration and Intensity of Path Loss in a Microwave Transhorizon Sea-Path," Electronics Letters, IEE, Vol. 26, No. 7, pp. 474-476 (March 29, 1990).
Tawfik, A.N. and Vilar, E., "X-Band Transhorizon Measurements of CW Transmissions Over the Sea- Part 1: Path Loss, Duration of Events, and Their Modeling," IEEE Transactions on Antennas and Propagation, IEEE Antennas and Propagation Society, Vol. 41, No. 11, pp. 1491-1500 (November 1993).
Temes, G.C. and Tsividis, T., "The Special Section on Switched-Capacitor Circuits," Proceedings of the IEEE, IEEE, Vol. 71, No. 8, pp. 915-916 (August 1983).
Thomas, G.B., Calculus and Analytic Geometry, Third Edition, Addison-Wesley Publishing, pp. 119-133 (1960).
Tomassetti, Q., "An Unusual Microwave Mixer," 16th European Microwave Conference, Microwave Exhibitions and Publishers, pp. 754-759 (September 8-12, 1986).
Tortoli, P. et al., "Bidirectional Doppler Signal Analysis Based on a Single RF Sampling Channel," IEEE Transactions on Ultrasonics, Ferroelectrics, and Frequency Control, IEEE Ultrasonics, Ferroelectrics, and Frequency Control Society, Vol. 41, No. 1, pp. 1-3 (January 1984).
Tsividis, Y. and Antognetti, P. (Ed.), Design of MOS VLSI Circuits for Telecommunications, Prentice-Hall, p. 304 (1985).
Tsividis, Y., "Principles of Operation and Analysis of Switched-Capacitor Circuits," Proceedings of the IEEE, IEEE, Vol. 71, No. 8, pp. 926-940 (August 1983).

UNITED STATES PATENT AND TRADEMARK OFFICE
CERTIFICATE OF CORRECTION

PATENT NO.        : 7,209,725 B1
APPLICATION NO. : 09/476092
DATED             : April 24, 2007
INVENTOR(S)       : Sorrells et al.

It is certified that error appears in the above-identified patent and that said Letters Patent is hereby corrected as shown below:

Title Page, Item [56], OTHER PUBLICATIONS Section (cont'd)
Please add the following references:
Tsurumi, H. and Maeda, T., "Design Study on a Direct Conversion Receiver Front-End for 280 MHZ, 900 MHZ, and 2.6 Ghz Band Radio Communication Systems," 41st IEEE Vehicular Technology Conference, IEEE Vehicular Technology Society, pp. 457-462 (May 19-22, 1991).
Valdmanis, J.A. et al., "Picosecond and Subpicosend Optoelectronics for Measurements of Future High Speed Electronic Devices," IEDM Technical Digest, IEEE, pp. 597-600 (December 5-7, 1983).
van de Kamp, M.M.J.L., "Asymmetric signal level distribution due to tropospheric scintillation," Electronics Letters, IEE, Vol. 34, No. 11, pp. 1145-1146 (May 28, 1998).
Vasseur, H. and Vanhoenacker, D., "Characterization of tropospheric turbulent layers from radiosonde data," Electronics Letters, IEE, Vol. 34, No. 4, pp. 318-319 (February 19, 1998).
Verdone, R., "Outage Probability Analysis for Short-Range Communication Systems at 60 Ghz in ATT Urban Environments," IEEE Transactions on Vehicular Technology, IEEE Vehicular Technology Society, Vol. 46, No. 4, pp. 1027-1039 (November 1997).
Vierira-Ribeiro, S.A., Single-IF DECT Receiver Architecture using a Quadrature Sub-Sampling Band-Pass Sigma-Delta Modulator, Thesis for Degree of Master's of Engineering, Carleton University, UMI Dissertation Services, pp. 1-180 (April 1995).
Vilar, E. et al., "A Comprehensive/Selective MM-Wave Satellite Downlink Experiment on Fade Dynamics," Tenth International Conference on Antennas and Propagation, Electronics Division of the IEE, pp. 2.98-2.101 (April 14-17, 1997).
Vilar, E. et al., "A System to Measure LOS Atmospheric Transmittance at 19 Ghz," AGARD Conference Proceedings No. 346: Characteristics of the Lower Atmosphere Influencing Radio Wave Propagation, AGARD, pp. 8-1 - 8-16 (October 4-7, 1983).
Vilar, E. and Smith, H., "A Theoretical and Experimental Study of Angular Scintillations in Earth Space Paths," IEEE Transactions on Antennas and Propagation, IEEE, Vol. AP-34, No. 1, pp. 2-10 (January 1986).
Vilar, E. et al., "A Wide Band Transhorizon Experiment at 11.6 Ghz," Eighth International Conference on Antennas and Propagation, Electronics Division of the IEE, pp. 441-445 (March 30- April 2, 1993).
Vilar, E. and Matthews, P.A., "Amplitude Dependence of Frequency in Oscillators," Electronics Letters, IEE, Vol. 8, No. 20, pp. 509-511 (October 5, 1972).
Vilar, E. et al., "An experimental mm-wave receiver system for measuring phase noise due to atmospheric turbulence," Proceedings of the 25th European Microwave Conference, Nexus House, pp. 114-119 (1995).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Vilar, E. and Burgueño, A., "Analysis and Modeling of Time Intervals Between Rain Rate Exceedances in the Context of Fade Dynamics," IEEE Transactions on Communications, IEEE Communications Society, Vol. 39, No. 9, pp. 1306-1312 (September 1991).
Vilar, E. et al., "Angle of Arrival Fluctuations in High and Low Elevation Earth Space Paths," Fourth International Conference on Antennas and Propagation (ICAP 85), Electronics Division of the IEE, pp. 83-88 (April 16-19, 1985).
Vilar, E., "Antennas and Propagation: A Telecommunications Systems Subject," Electronics Division Colloquium on Teaching Antennas and Propagation to Undergraduates, IEE, pp. 7/1-7/6 (March 8, 1988).
Vilar, E. et al., "CERS*. Millimetre-Wave Beacon Package and Related Payload Doppler Correction Strategies," Electronics Division Colloquium on
CERS- Communications Engineering Research Satellite, IEE, pp. 10/1-10/10 (April 10, 1984).
Vilar, E. and Moulsley, T.J., "Comment and Reply: Probability Density Function of Amplitude Scintillations," Electronics Letters, IEE, Vol. 21, No. 14, pp. 620-622 (July 4, 1985).
Vilar, E. et al., "Comparison of Rainfall Rate Duration Distributions for ILE-IFE and Barcelona," Electronics Letters, IEE, Vol. 28, No. 20, pp. 1922-1924 (September 24, 1992).
Vilar, E., "Depolarization and Field Transmittances in Indoor Communications," Electronics Letters, IEE, Vol. 27, No. 9, pp. 732-733 (April 25, 1991).
Vilar, E. and Larsen, J.R., "Elevation Dependence of Amplitude Scintillations on Low Elevation Earth Space Paths," Sixth International Conference on Antennas and Propagation (ICAP 89) Part 2: Propagation, IEE, pp. 150-154 (April 4-7, 1989).
Vilar, E. et al., "Experimental System and Measurements of Transhorizon Signal Levels at 11 Ghz," 18th European Microwave Conference, Microwave Exhibitions and Publishers Ltd., pp. 429-435 (September 12 - 15, 1988).
Vilar, E. and Matthews, P.A., "Importance of Amplitude Scintillations in Millimetric Radio Links," Proceedings of the 4th European Microwave Conference, Microwave Exhibitions and Publishers, pp. 202-206 (September 10-13, 1974).
Vilar, E. and Haddon, J., "Measurement and Modeling of Scintillation Intensity to Estimate Turbulence Parameters in an Earth-Space Path," IEEE Transactions on Antennas and Propagation, IEEE Antennas and Propagation Society, Vol. AP-32, No. 4, pp. 340-346 (April 1984).
Vilar, E. and Matthews, P.A., "Measurement of Phase Fluctuations on Millimetric Radiowave Propagation," Electronics Letters, IEE, Vol. 7, No. 18, pp. 566-568

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

(September 9, 1971).
<u>Title Page, Item [56], OTHER PUBLICATIONS Section</u> (cont'd)
Please add the following references:
Vilar, E. and Wan, K.W., "Narrow and Wide Band Estimates of Field Strength for Indoor Communications in the Millimetre Band," Electronics Division Colloquium on Radiocommunications in the Range 30-60 Ghz, IEE, pp. 5/1-5/8 (January 17, 1991).
Vilar, E. and Faulkner, N.D., "Phase Noise and Frequency Stability Measurements. Numerical Techniques and Limitations," Electronics Division Colloquium on Low Noise Oscillators and Synthesizer, IEE, 5 pages (January 23, 1986).
Vilar, E. and Senin, S., "Propagation phase noise identified using 40 Ghz satellite downlink," Electronics Letters, IEE, Vol. 33, No. 22, pp. 1901-1902
(October 23, 1997).
Vilar, E. et al., "Scattering and Extinction: Dependence Upon Raindrop Size Distribution in Temperate (Barcelona) and Tropical (Belem) Regions," Tenth International Conference on Antennas and Propagation, Electronics Division of the IEE, pp. 2.230-2.233 (April 14-17, 1997).
Vilar, E. and Haddon, J., "Scintillation Modeling and Measurement - A Tool for Remote-Sensing Slant Paths," AGARD Conference Proceedings No. 332: Propagation Aspects of Frequency Sharing, Interference And System Diversity, AGARD, pp. 27-1 - 27-13 (October 18-22, 1982).
Vilar, E., "Some Limitations on Digital Transmission Through Turbulent Atmosphere," International Conference on Satellite Communication Systems Technology, Electronics Division of the IEE, pp. 169-187 (April 7-10, 1975).
Vilar, E. and Matthews, P.A., "Summary of Scintillation Observations in a 36 Ghz Link Across London," International Conference on Antennas and Propagation Part 2: Propagation, IEE, pp. 36-40 (November 28-30, 1978).
Vilar, E. et al., "Wideband Characterization of Scattering Channels," Tenth International Conference on Antennas and Propagation, Electronics Division of the IEE, pp. 2.353-2.358 (April 14-17, 1997).
Vollmer, A., "Complete GPS Receiver Fits on Two Chips," Electronic Design, Penton Publishing, pp. 50, 52, 54 and 56 (July 6, 1998).
Voltage and Time Resolution in Digitizing Oscilloscopes: Application Note 348, Hewlett Packard, pp. 1-11 (November 1986).
Wan, K.W. et al., "A Novel Approach to the Simultaneous Measurement of Phase and Amplitude Noises in Oscillator," Proceedings of the 19th European Microwave Conference, Microwave Exhibitions and Publishers Ltd., pp. 809-813
(September 4-7, 1989).
Wan, K.W. et al., "Extended Variances and Autoregressive/Moving Average Algorithm for the Measurement and Synthesis of Oscillator Phase Noise," Proceedings Of the 43rd Annual Symposium on Frequency Control, IEEE, pp. 331-335 (1989).

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

Title Page, Item [56], OTHER PUBLICATIONS Section (cont'd)
Please add the following references:
Wan, K.W. et al., "Wideband Transhorizon Channel Sounder at 11 Ghz," Electronics Division Colloquium on High Bit Rate UHF/SHF Channel Sounders - Technology and Measurement, IEE, pp. 3/1-3/5 (December 3, 1993).
Wang, H., "A 1-V Multigigahertz RF Mixer Core in 0.5 - μm CMOS," IEEE Journal of Solid-State Circuits, IEEE Solid-State Circuits Society, Vol. 33, No. 12, pp. 2265-2267 (December 1998).
Watson, A.W.D. et al., "Digital Conversion and Signal Processing for High Performance Communications Receivers," Digital Processing of Signals in Communications, Institution of Electronic and Radio Engineers, pp. 367-373 (April 22nd -26th, 1985).
Weast, R.C. et al. (Ed.), Handbook of Mathematical Tables, Second Edition, The Chemical Rubber Co., pp. 480-485 (1964).
Wiley, R.G., "Approximate FM Demodulation Using Zero Crossings," IEEE Transactions on Communications, IEEE, Vol. COM-29, No. 7, pp. 1061-1065 (July 1981).
Worthman, W., "Convergence... Again," RF Design, Primedia, p. 102 (March 1999).
Young, I.A. and Hodges, D.A., "MOS Switched-Capacitor Analog Sampled-Data Direct-Form Recursive Filters," IEEE Journal of Solid-State Circuits, IEEE, Vol. SC-14, No. 6, pp. 1020-1033 (December 1979).
Translation of Specification and Claims of FR Patent No. 2245130, 3 pages.
Fest, Jean-Pierre, "Le Convertisseur A/N Revolutionne Le Recepteur Radio," Electronique, JMJ (Publisher), No. 54, pp. 40-42 (December 1995).
Translation of DE Patent No. 35 41 031 A1, 22 pages.
Translation of EP Patent No. 0 732 803 A1, 9 pages.
Fest, Jean-Pierre, "The A/D Converter Revolutionizes the Radio Receiver," Electronique, JMJ (Publisher), No. 54, 3 pages (December 1995). (Translation of Doc. AQ50).
Translation of German Patent No. DE 197 35 798 C1, 8 pages.
Miki, S. and Nagahama, R., Modulation System II, Common Edition 7, Kyoritsu Publishing Co., Ltd., pp. 146-154 (April 30, 1956).
Miki, S. and Nagahama, R., Modulation System II, Common Edition 7, Kyoritsu Publishing Co., Ltd., pp. 146-149 (April 30, 1956). (Partial Translation of Doc. AQ51).
Rabiner, L.R. and Gold, B., Theory And Application Of Digital Signal Processing, Prentice-Hall, Inc., pp. xiii-xii and 40-46 (1975).
English-language Abstract of JP 08-032556, published February 2, 1996, from http://www1.ipdl.jpo.go.jp, 2 Pages (last visited December 14, 2001).
English-language Abstract of JP 08-139524, published May 31, 1996, from

UNITED STATES PATENT AND TRADEMARK OFFICE
CERTIFICATE OF CORRECTION

PATENT NO. : 7,209,725 B1
APPLICATION NO. : 09/476092
DATED : April 24, 2007
INVENTOR(S) : Sorrells et al.

It is certified that error appears in the above-identified patent and that said Letters Patent is hereby corrected as shown below:

http://www1.ipdl.jpo.go.jp, 2 Pages (last visited December 14, 2001).
Title Page, Item [56], OTHER PUBLICATIONS Section (cont'd)
Please add the following references:
English-language Abstract of JP 63-054002, published March 8, 1988, from http://www1.ipdl.jpo.go.jp, 2 Pages (last visited January 2, 2002).
English-language Abstract of JP 06-237276, published August 23, 1994, from http://www1.ipdl.jpo.go.jp, 2 Pages (last visited January 2, 2002).
English-language Abstract of JP 08-023359, published January 23, 1996, from http://www1.ipdl.jpo.go.jp, 2 Pages (last visited January 2, 2002).

Signed and Sealed this

Ninth Day of October, 2007

JON W. DUDAS
*Director of the United States Patent and Trademark Office*